(12) United States Patent
Pyun et al.

(10) Patent No.: US 10,917,010 B2
(45) Date of Patent: Feb. 9, 2021

(54) DRIVING VOLTAGE PROVIDER

(71) Applicant: Samsung Display Co., Ltd., Yongin-si (KR)

(72) Inventors: Ki Hyun Pyun, Yongin-si (KR); Seung Woon Shin, Yongin-si (KR); Jong Young Yun, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/437,572

(22) Filed: Jun. 11, 2019

(65) Prior Publication Data

US 2020/0036288 A1 Jan. 30, 2020

(30) Foreign Application Priority Data

Jul. 27, 2018 (KR) .................. 10-2018-0087729

(51) Int. Cl.
*H02M 3/157* (2006.01)
*H02M 3/158* (2006.01)
*H02M 1/08* (2006.01)
*H03K 7/08* (2006.01)
*H02M 1/00* (2006.01)
*H02M 3/156* (2006.01)

(52) U.S. Cl.
CPC .............. *H02M 3/157* (2013.01); *H02M 1/08* (2013.01); *H02M 3/158* (2013.01); *H03K 7/08* (2013.01); *H02M 2001/0012* (2013.01); *H02M 2001/0025* (2013.01); *H02M 2003/1566* (2013.01)

(58) Field of Classification Search
CPC ........... H02M 1/08; H02M 2001/0003; H02M 2001/0006; H02M 2001/0012; H02M 2001/0041; H02M 3/156; H02M 3/157; H02M 2001/0025; H03K 7/08; H03K 3/017; H03K 5/1565

See application file for complete search history.

(56) References Cited

U.S. PATENT DOCUMENTS 6,445,232 B1* 9/2002 Logue ................ H03L 7/08
327/115
9,030,244 B1* 5/2015 Luo .................. H03K 3/017
327/175

(Continued)

FOREIGN PATENT DOCUMENTS

KR 10-0927649 B1 11/2009
KR 10-1742760 B1 6/2017

*Primary Examiner* — Alex Torres-Rivera
(74) *Attorney, Agent, or Firm* — Lewis Roca Rothgerber Christie LLP

(57) ABSTRACT

A driving voltage provider includes: a PLL circuit for generating clock signals with different phases according to a divider value; a DC-DC converter for generating a PWM signal according to the frequency of a first clock signal, and providing a driving voltage based on the duty ratio of the PWM signal; a first tuning circuit for outputting a first tuning signal having a first logic level when the logic levels of first and second sampling signals obtained by sampling the PWM signal at transition times of different clock signals are different, and outputting the first tuning signal having a second logic level when the first and second sampling signals have the same logic level; and a divider value determiner for decreasing the divider value when the logic level of the first tuning signal is the first logic level.

16 Claims, 16 Drawing Sheets

(56) References Cited

U.S. PATENT DOCUMENTS

| | | | |
|---|---|---|---|
| 9,871,447 B2 | 1/2018 | Jung et al. | |
| 2006/0255866 A1* | 11/2006 | Hirai | H03K 7/08 |
| | | | 331/45 |
| 2008/0012647 A1* | 1/2008 | Risbo | H03L 7/093 |
| | | | 331/16 |
| 2012/0242314 A1* | 9/2012 | Namekawa | H02M 3/157 |
| | | | 323/283 |
| 2014/0043006 A1* | 2/2014 | Tan | H02M 3/157 |
| | | | 323/298 |
| 2015/0280560 A1* | 10/2015 | Guo | H02M 3/1584 |
| | | | 323/271 |
| 2016/0336848 A1* | 11/2016 | Meola | H02M 3/04 |
| 2018/0054130 A1 | 2/2018 | Moon et al. | |
| 2018/0062546 A1 | 3/2018 | Xiang et al. | |

* cited by examiner

DRIVING VOLTAGE PROVIDER

CROSS-REFERENCE TO RELATED APPLICATION

This application claims priority to and the benefit of Korean patent application 10-2018-0087729, filed on Jul. 27, 2018, in the Korean Intellectual Property Office, the entire disclosure of which is incorporated herein by reference.

BACKGROUND

1. Field

The present disclosure generally relates to a driving voltage provider.

2. Related Art

With the development of information technologies, the importance of display devices which are connection mediums between users and information increases. Accordingly, display devices such as liquid crystal display devices, organic light emitting display devices, and plasma display devices are increasingly used.

A display device may include a driving voltage provider for providing a driving voltage. The driving voltage provider may be provided in the form of a so-called Power Management Integrated Circuit (PMIC).

The conventional driving voltage providers are driven at the same frequency regardless of fluctuation of a load. Therefore, the same control power is consumed even when the load decreases.

SUMMARY

Aspects of embodiments provide a driving voltage provider (e.g., a driving voltage circuit) capable of reducing the consumption of control power and decreasing thermal stress when a load decreases.

According to an embodiment of the present disclosure, there is provided a driving voltage provider including: a phase-locked loop (PLL) circuit configured to generate a first clock signal and a second clock signal having, according to a divider value and a reference clock signal; a DC-DC converter configured to generate a pulse-width modulation (PWM) signal according to the frequency of the first clock signal, and generate a driving voltage according to a duty ratio of the PWM signal; a first tuning circuit configured to output a first tuning signal having a first logic level when a logic level of a first sampling signal obtained by sampling the PWM signal at a transition time of the first clock signal is different from a logic level of a second sampling signal obtained by sampling the PWM signal at a transition time of the second clock signal, and output the first tuning signal having a second logic level when the first and second sampling signals have the same logic level; and a divider value determiner configured to decrease the divider value by a first decrement amount when the logic level of the first tuning signal is the first logic level.

The driving voltage provider may further include a second tuning circuit configured to generate an interpolation clock signal having a phase between the phase of the first clock signal and the phase of the second clock signal when the logic level of the first tuning signal is the first logic level, output a second tuning signal having a third logic level when a logic level of a fifth sampling signal obtained by sampling the PWM signal at the transition time of the first clock signal is different from a logic level of an interpolation sampling signal obtained by sampling the PWM signal at a transition time of the interpolation clock signal, and output the second tuning signal having a fourth logic level when the fifth sampling signal and the interpolation sampling signal have the same logic level.

The second tuning circuit may change the phase of the interpolation clock signal when the second tuning signal having the third logic level is output.

When the logic level of the first tuning signal is the first logic level, the divider value determiner may determine the first decrement amount based on the logic level of the second tuning signal.

When the logic level of the first tuning signal is the first logic level, the divider value determiner may determine the first decrement amount based on a count number, wherein, in each count time point, the count number is increased when the logic level of the second tuning signal is the third logic level, and wherein, in each count time point, the count number is maintained when the logic level of the second tuning signal is the fourth logic level.

When the logic level of the first tuning signal is the first logic level, the divider value determiner may increase the first decrement amount when the count number increases.

The count time point is synchronized with a transition time of the first clock signal.

The PLL circuit may further generate a third clock signal having a phase different from the phase of the first clock signal and the phase of the second clock signal. The first tuning circuit may output a third tuning signal having a fifth logic level when the logic level of the second sampling signal is different from a logic level of a third sampling signal obtained by sampling the PWM signal at a transition time of the third clock signal, and output the third tuning signal having a sixth logic level when the second and third sampling signals have the same logic level The divider value determiner may decrease the divider value by a second decrement amount when the logic level of the third tuning signal is the fifth logic level. The second decrement amount may be lower than the first decrement amount.

The PLL circuit may further generate a fourth clock signal having a phase different from those of the first, second, and third clock signals. The first tuning circuit may output a fourth tuning signal having a seventh logic level when the logic level of the third sampling signal is different from a logic level of a fourth sampling signal obtained by sampling the PWM signal at a transition time of the fourth clock signal, and output the fourth tuning signal having an eighth logic level when the third and fourth sampling signals have the same logic level.

The divider value determiner may decrease the divider value by a third decrement amount when the logic level of the fourth tuning signal is the seventh logic level. The third decrement amount may be lower than the second decrement amount.

The first tuning circuit may include: a first flip-flop configured to sample the PWM signal according to the first clock signal; a second flip-flop configured to sample an output signal of the first flip-flop according to the first clock signal; a third flip-flop configured to sample the PWM signal according to the second clock signal; a fourth flip-flop configured to sample an output signal of the third flip-flop according to the first clock signal; a fifth flip-flop configured to sample the PWM signal according to the third clock signal; a sixth flip-flop configured to sample an output signal of the fifth flip-flop according to the first clock signal; a seventh flip-flop configured to sample the PWM signal according to the fourth clock signal; and an eighth flip-flop configured to sample an output signal of the seventh flip-flop according to the first clock signal.

The first tuning circuit may further include: a first XOR gate configured to receive output signals of the second and fourth flip-flops; a second XOR gate configured to receive output signals of the fourth and sixth flip-flops; and a third XOR gate configured to receive output signals of the sixth and eighth flip-flops. The first tuning signal may correspond to an output signal of the first XOR gate, the third tuning signal may correspond to an output signal of the second XOR gate, and the fourth tuning signal may correspond to an output signal of the third XOR gate.

The second tuning circuit may include: a first switch configured to turn on or off according to the first tuning signal, the first switch being coupled to the PWM signal; a second switch configured to turn on or off according to the first tuning signal, the second switch being coupled to the first clock signal; and a third switch configured to turn on or off according to the first tuning signal, the third switch being coupled to the second clock signal.

The second tuning circuit may further include: a ninth flip-flop configured to sample an output signal of the first switch according to the first clock signal; a tenth flip-flop configured to sample an output signal of the ninth flip-flop according to the first clock signal; an eleventh flip-flop configured to sample the output signal of the first switch according to the interpolation clock signal; and a twelfth flip-flop configured to sample an output signal of the eleventh flip-flop according to the first clock signal.

The second tuning circuit may further include: a phase interpolator configured to be enabled or disabled by the second tuning signal, the phase interpolator receiving output signals of the second and third switches to generate the interpolation clock signal when the phase interpolator is enabled; and a fourth XOR gate configured to receive output signals of the tenth and twelfth flip-flops to generate the second tuning signal.

BRIEF DESCRIPTION OF THE DRAWINGS

Example embodiments will now be described more fully hereinafter with reference to the accompanying drawings; however, the invention of the present disclosure may be embodied in different forms and should not be construed as limited to the embodiments set forth herein. Rather, these embodiments are provided so that this disclosure will be thorough and complete, and will fully convey the scope of the example embodiments to those skilled in the art.

In the figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
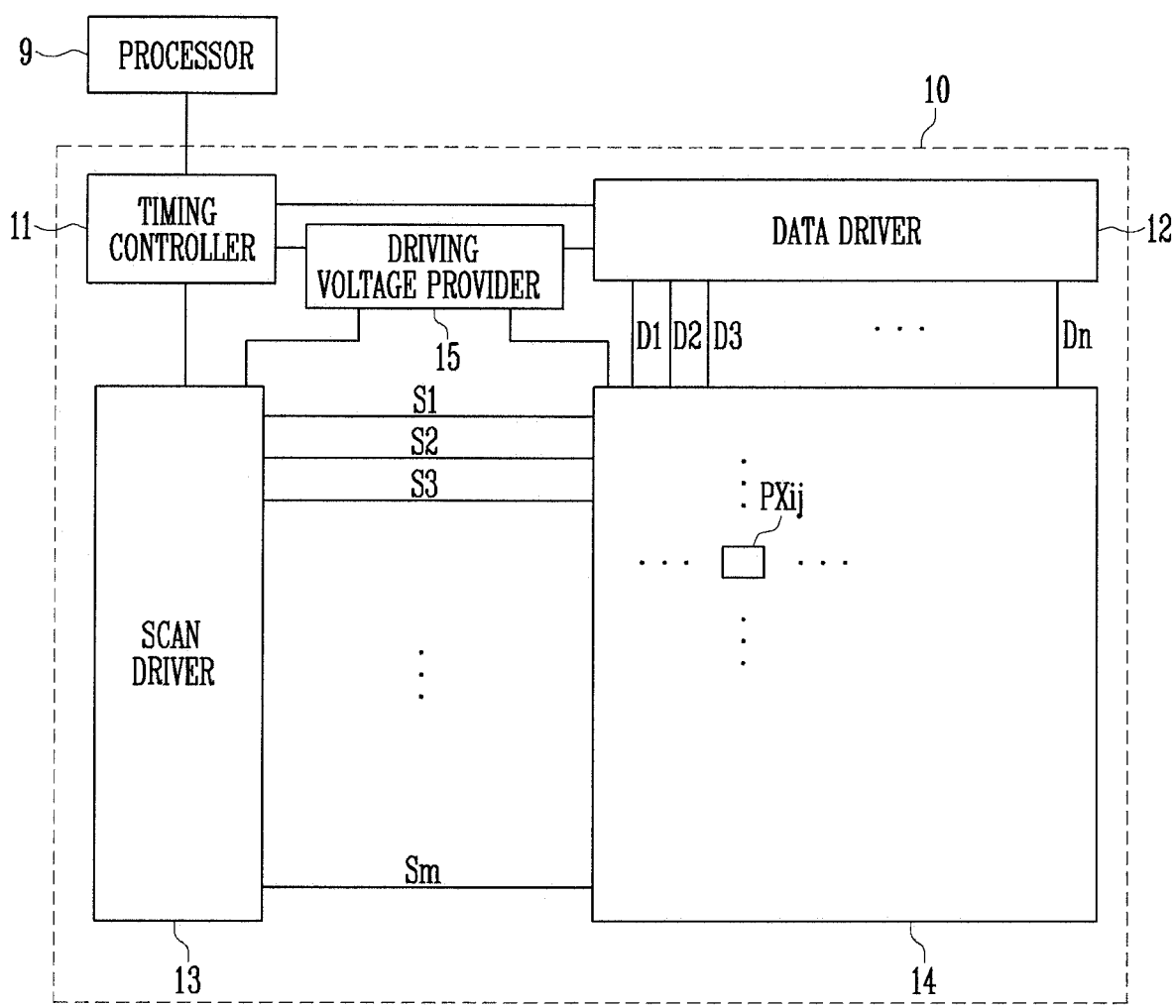
FIG. 1 is a diagram illustrating a display device according to an embodiment of the present disclosure.

Hereinafter, exemplary embodiments are described in detail with reference to the accompanying drawings so that those skilled in the art may easily practice the present disclosure. The present disclosure may be implemented in various different forms and is not limited to the exemplary embodiments described in the present specification.

Parts which are unnecessary to understanding of the described embodiment may be omitted to clearly describe the embodiments of the present disclosure, and the same or similar constituent elements may be designated by the same reference numerals throughout the specification. Therefore, the same reference numerals may be used in different drawings to identify the same or like elements, and repeated description thereof may be omitted.

In addition, the size and thickness of each component illustrated in the drawings are arbitrarily shown for better understanding and ease of description, but the present disclosure is not limited thereto. Thicknesses of several portions and regions may be exaggerated for clear expressions.

FIG. 1 is a diagram illustrating a display device according to an embodiment of the present disclosure.

Referring to FIG. 1, the display device 10 according to the embodiment of the present disclosure may include a timing controller 11, a data driver 12, a scan driver 13, a pixel unit 14 (e.g., a display unit), and a driving voltage provider 15.

A processor 9 may be a general-purpose processing device. For example, the processor 9 may be an application processor (AP), a central processing unit (CPU), a graphics processing unit (GPU), a micro-controller unit (MCU), a host system, etc.

The processor 9 may provide the timing controller 11 with control signals to display an image frame and gray scale values for each pixel. The control signals may include, for example, a data enable signal, a vertical synchronization signal, a horizontal synchronization signal, and/or the like. For example, the data enable signal may be an identifier indicating transmission of gray scale values. The vertical synchronization signal may be an identifier indicating the start or the end of an image frame. The horizontal synchronization signal may be an identifier indicating the start or the end of a pixel row in an image frame.

The timing controller 11 may provide the scan driver 13 with a clock signal, a scan start signal, etc. to satisfy specifications of the scan driver 13, based on the received control signals. Also, the timing controller 11 may provide the data driver 12 with gray scale values and control signals, which are modified or maintained to satisfy specifications of the data driver 12, based on the gray scale values and control signals received from the processor 9.

The data driver 12 may generate data voltages to be provided to data lines D1 to Dn (D1, D2, D3, . . . , and Dn), using the gray scale values and the control signals, which are received from the timing controller 11. For example, data voltages generated in units of pixel rows may be simultaneously or concurrently applied to the data lines D1 to Dn in response to an output control signal included in a control signal.

The scan driver 13 may generate scan signals to be provided to scan lines S1 to Sm (S1, S2, S3, . . . , and Sm) by receiving control signals including a clock signal, a scan start signal, and the like from the timing controller 11. The scan driver 13 may provide scan signals through the scan lines S1 to Sm to select at least some pixels of the pixel unit 14 in which data voltages are to be written. For example, the scan driver 13 may sequentially provide scan signals having a turn-on level to the scan lines S1 to Sm to select a pixel row to which data voltages are to be written. The scan driver 13 may be configured in the form of a shift register, and generate scan signals in a manner that sequentially transfers the scan start signal to a next stage circuit under the control of the clock signal.

The pixel unit 14 includes pixels. Each pixel PXij may be coupled to a corresponding data line and a corresponding scan line. For example, when data voltages for one pixel row are applied to the data lines D1 to Dn from the data driver 12, the data voltages may be written to a pixel row located at a scan line that receives a scan signal having the turn-on level from the scan driver 13. Such a driving method will be described in more detail with reference to FIGS. 2 and 3.

The driving voltage provider 15 may generate a PWM signal according to the frequency of a clock signal (e.g., a clock signal received from the timing controller 11), and provide a driving voltage generated according to the duty ratio of the PWM signal to at least one of the pixel unit 14, the data driver 12, and the scan driver 13. The clock signal may be different from that provided from the timing controller 11 to the scan driver 13. The driving voltage provider 15 will be described in more detail later with reference to drawings from FIG. 5.

Figure 2:
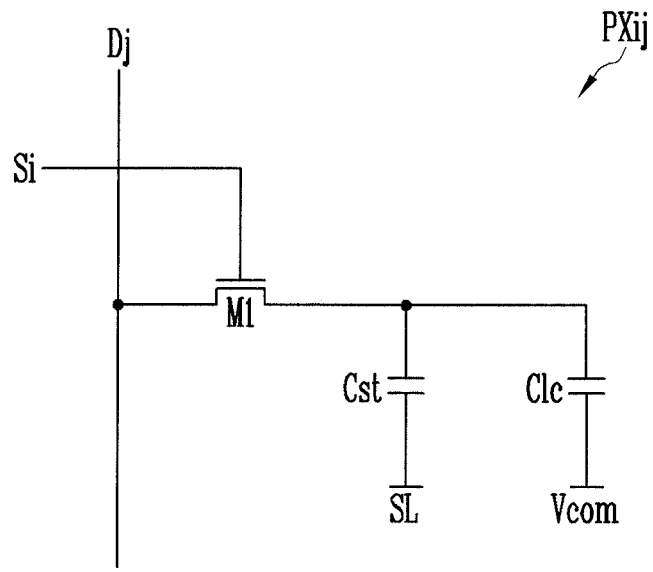
FIG. 2 is a diagram illustrating a pixel according to an embodiment of the present disclosure.

FIG. 2 is a diagram illustrating a pixel according to an embodiment of the present disclosure.

Referring to FIG. 2, the pixel PXij may include a transistor M1, a storage capacitor Cst, and a liquid crystal capacitor Clc.

The pixel PXij of FIG. 2 may be employed in embodiments where the display device 10 of FIG. 1 is a liquid crystal display device.

In this embodiment, the transistor M1 is illustrated as an N-type transistor, and therefore, the turn-on level of a scan signal may be a high level. In some other embodiments, the pixel circuit may perform the same function using a P-type transistor.

A gate electrode of the transistor M1 may be coupled to a scan line Si, one electrode of the transistor M1 may be coupled to a data line Dj, and the other electrode of the transistor M1 may be coupled to one electrode of the storage capacitor Cst and a pixel electrode of the liquid crystal capacitor Clc.

The one electrode of the storage capacitor Cst may be coupled to the other electrode of the transistor M1, and the other electrode of the storage capacitor Cst may be coupled to a sustain voltage line SL. In some embodiments, when the capacity of the liquid crystal capacitor Clc is sufficient, the configuration including the storage capacitor Cst may be excluded.

The pixel electrode of the liquid crystal capacitor Clc may be coupled to the other electrode of the transistor M1, and a common voltage Vcom may be applied to a common electrode of the liquid crystal capacitor Clc.

When the scan signal having the turn-on level is supplied to the gate electrode of the transistor M1 through the scan line Si, the transistor M1 connects the data line Dj and the one electrode of the storage capacitor Cst. Therefore, a voltage corresponding to the difference between a data voltage applied through the data line Dj and a sustain voltage of the sustain voltage line SL is stored in the storage capacitor Cst. The data voltage is sustained at the pixel electrode of the liquid crystal capacitor Clc by the storage capacitor Cst. Thus, an electric field corresponding to the difference between the data voltage and the common voltage is applied to a liquid crystal layer, and the orientation of liquid crystal molecules of the liquid crystal layer is determined according to the electric field. The pixel PXij can thereby emit light with a desired luminance while light of a backlight is passing through the liquid crystal molecules and a polarizing plate.

Figure 3:
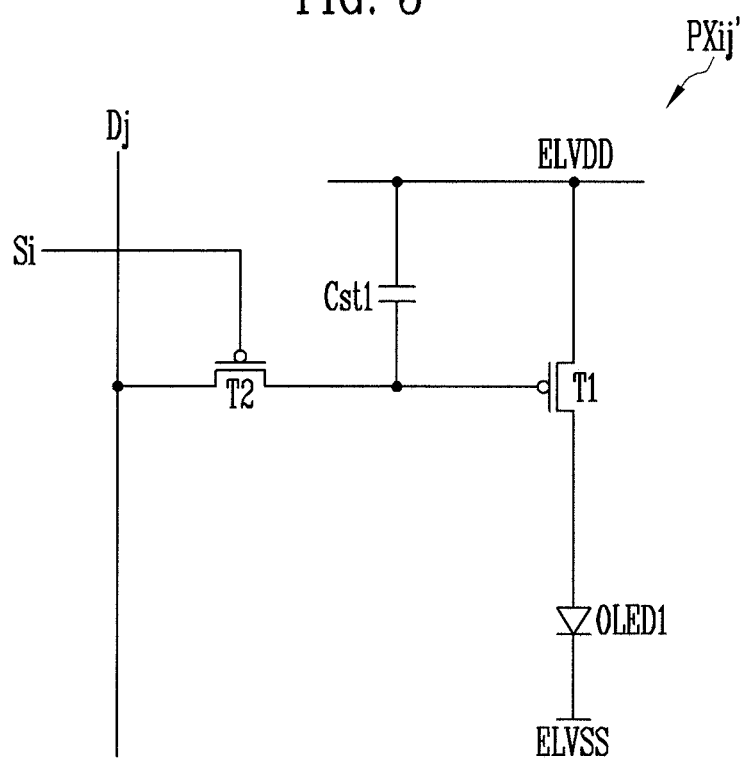
FIG. 3 is a diagram illustrating a pixel according to another embodiment of the present disclosure.

FIG. 3 is a diagram illustrating a pixel according to another embodiment of the present disclosure.

Referring to FIG. 3, the pixel PXij' may include transistors T1 and T2, a storage capacitor Cst1, and an organic light emitting diode OLED1.

The pixel PXij' of FIG. 3 may be employed in embodiments where the display device 10 of FIG. 1 is an organic light emitting display device.

In this embodiment, the transistors T1 and T2 are illustrated as P-type transistors, and therefore, the turn-on level of a scan signal may be a low level. In some other embodiments, the pixel circuit may perform the same function using one or more N-type transistors.

A gate electrode of the transistor T2 may be coupled to a scan line Si, one electrode of the transistor T2 may be coupled to a data line Dj, and the other electrode of the transistor T2 may be coupled to a gate electrode of the transistor T1. The transistor T2 may be referred to as a switching transistor, a scan transistor, etc.

The gate electrode of the transistor T1 may be coupled to the other electrode of the transistor T2, one electrode of the transistor T1 may be coupled to a first power voltage ELVDD, and the other electrode of the transistor T1 may be coupled to an anode electrode of the organic light emitting diode OLED1. The transistor T1 may be referred to as a driving transistor.

The storage capacitor Cst1 connects the one electrode and the gate electrode of the transistor T1.

The anode electrode of the organic light emitting diode OLED1 may be coupled to the other electrode of the transistor T1, and a cathode electrode of the organic light emitting diode OLED1 may be coupled to a second power voltage ELVSS.

When the scan signal having the turn-on level is supplied to the gate electrode of the transistor T2 through the scan line Si, the transistor T2 connects the data line Dj and one electrode of the storage capacitor Cst1. Therefore, a voltage corresponding to the difference between a data voltage applied through the data line Dj and the first power voltage ELVDD is written in the storage capacitor Cst1. The transistor T1 allows a driving current determined according to the voltage written in the storage capacitor Cst1 to flow from the first power voltage ELVDD to the second power voltage ELVSS through the organic light emitting diode OLED1. The organic light emitting diode OLED1 emits light with a luminance corresponding to an amount of the driving current.

Figure 4:
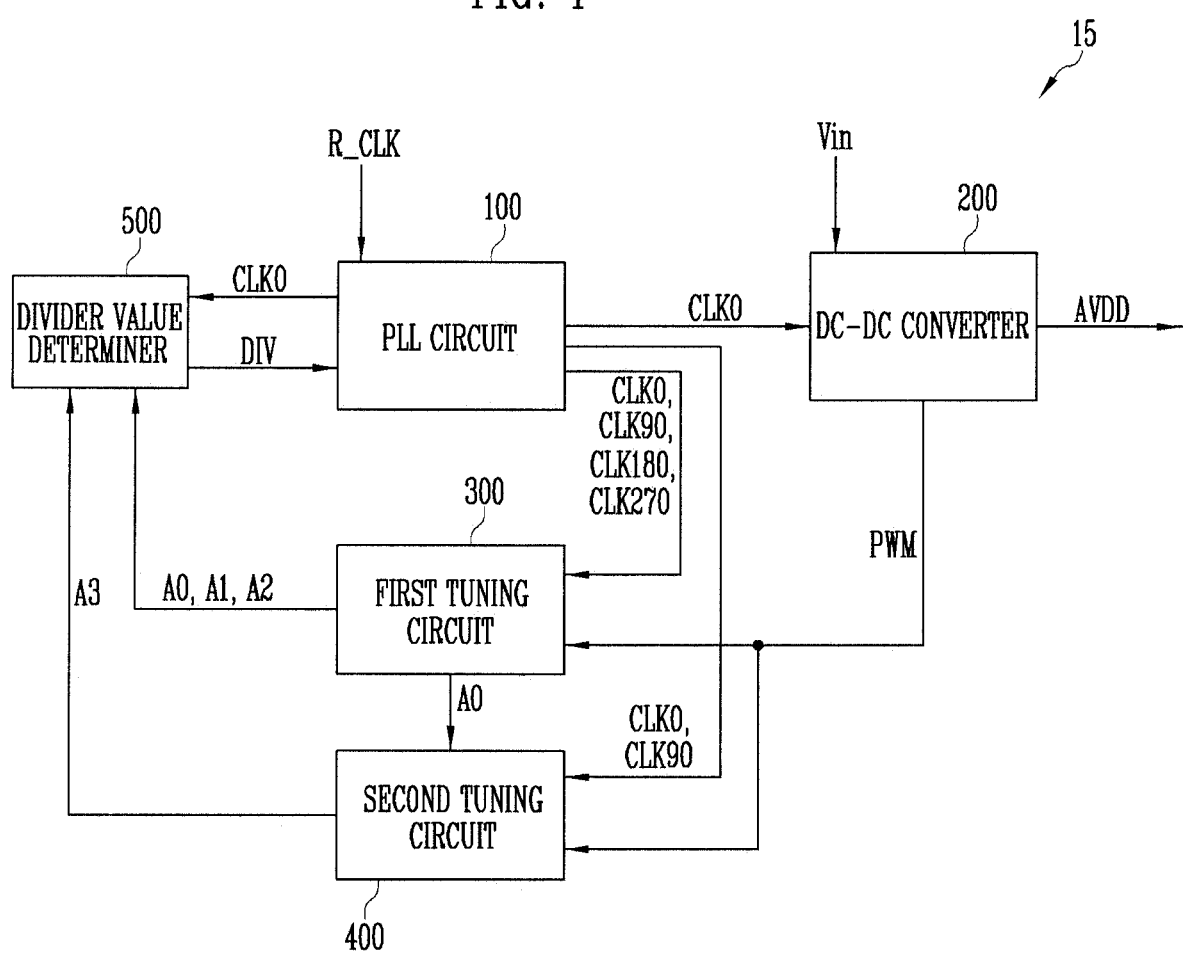
FIG. 4 is a diagram illustrating a driving voltage provider according to an embodiment of the present disclosure.

FIG. 4 is a diagram illustrating a driving voltage provider according to an embodiment of the present disclosure.

Referring to FIG. 4, the driving voltage provider 15 according to the embodiment of the present disclosure may include a phase-locked loop (PLL) circuit 100, a DC-DC converter 200, a first tuning circuit 300, a second tuning circuit 400, and a divider value determiner (e.g., a divider value determining circuit) 500.

The PLL circuit 100 may generate first to fourth clock signals CLK0, CLK90, CLK180, and CLK270 having different phases according to a divider value DIV and a reference clock signal R_CLK.

The DC-DC converter 200 may generate a PWM signal PWM according to the frequency of the first clock signal CLK0, and provide a driving voltage AVDD generated according to the duty ratio of the PWM signal PWM.

The first tuning circuit 300 may sample the PWM signal PWM, using the first to fourth clock signals CLK0, CLK90, CLK180, and CLK270, and output a first tuning signal A0, a third tuning signal A1, and a fourth tuning signal A2, which have logic levels, based on the sampling result. The first tuning circuit 300 will be described in more detail with reference to FIGS. 10 to 14.

The second tuning circuit 400 may be enabled or disabled based on the logic level of the first tuning signal A0. Also, the second tuning circuit 400 may generate an interpolation clock signal by interpolating the first clock signal CLK0 and the second clock signal CLK90. The second tuning circuit 400 may sample the PWM signal PWM, using the first clock signal CLK0 and the interpolation clock signal, and output a second tuning signal A3 having logic levels based on the sampling result. The second tuning circuit 400 will be described in more detail with reference to FIGS. 15 to 17.

The divider value determiner 500 may decrease the divider value DIV, based on the logic levels of the first to fourth tuning signals A0 to A3. The decrement amount of the divider value DIV will be described in more detail with reference to FIGS. 10 to 17.

Figure 5:
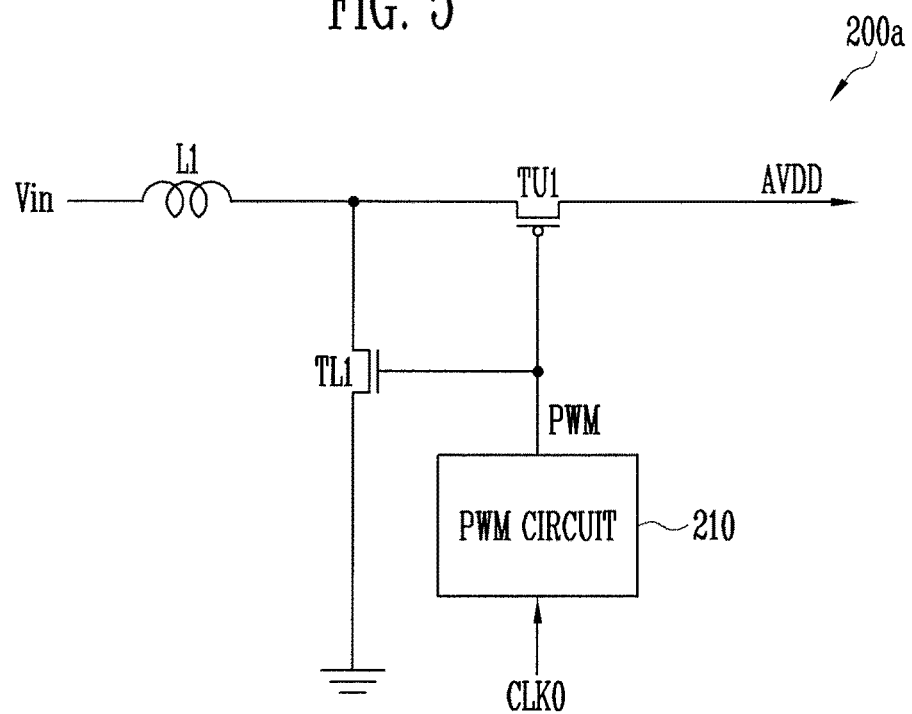
FIG. 5 is a diagram illustrating a DC-DC converter according to an embodiment of the present disclosure.

FIG. 5 is a diagram illustrating a DC-DC converter according to an embodiment of the present disclosure.

Referring to FIG. 5, the DC-DC converter 200a may be a boost converter. The DC-DC converter 200a may include transistors TU1 and TL1, an inductor L1, and a PWM circuit 210.

The PWM circuit 210 may generate a PWM signal PWM having a period corresponding to the frequency of the first clock signal CLK0. The PWM signal PWM may have an on/off duty ratio, and alternately turn on/off the transistors TL1 and TU1 (e.g., may turn each transistor on and off alternatingly, and/or may turn transistor TL1 on and transistor TU1 off, then turn transistor TL1 off and transistor TU1 on, alternatingly). The duty ratio of the PWM signal PWM may be determined independently from the frequency of the first clock signal CLK0.

First, when the transistor TL1 is turned on and the transistor TU1 is turned off, energy is stored in the inductor L1 while the current of the inductor L1 is increasing. Next, when the transistor TL1 is turned off and the transistor TU1 is turned on, the energy of the inductor L1 is discharged while the current of the inductor L1 is decreasing. Therefore, a driving voltage AVDD amplified by adding an input voltage Vin and the current flowing from the inductor L1 is output (e.g., the energy of the inductor L1 may be discharged as a current through TU1 and generate the driving voltage AVDD). When the duty ratio of the PWM signal PWM increases, the driving voltage AVDD can be further amplified (e.g., the transistor TL1 may have a longer on-time each period, and more energy can therefore be stored in inductor L1 to be discharged and generate voltage AVDD).

Figure 6:
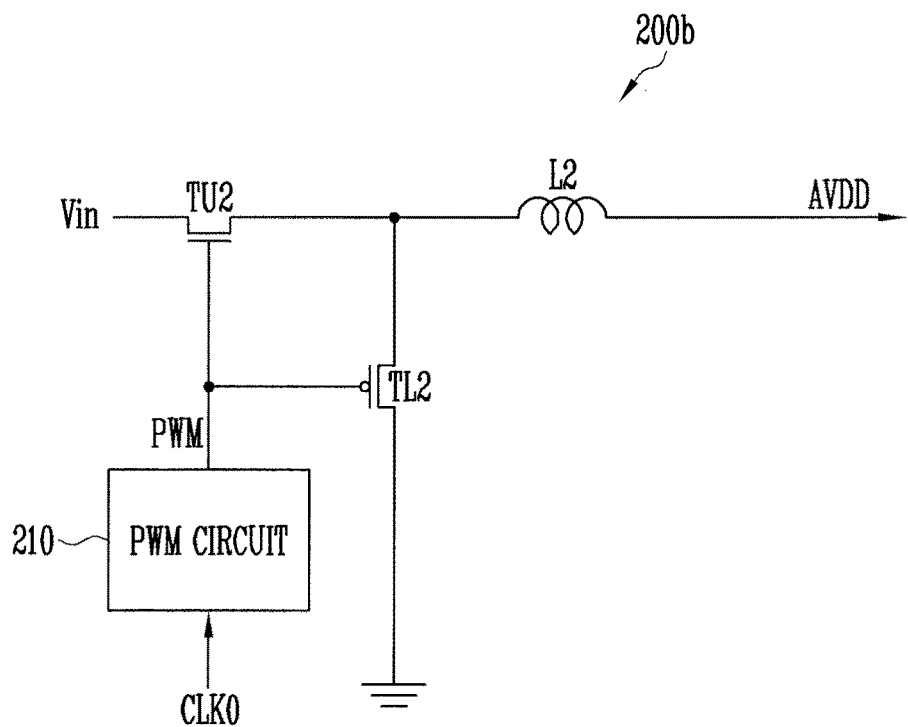
FIG. 6 is a diagram illustrating a DC-DC converter according to another embodiment of the present disclosure.

FIG. 6 is a diagram illustrating a DC-DC converter according to another embodiment of the present disclosure.

Referring to FIG. 6, the DC-DC converter 200b may be a buck converter. The DC-DC converter 200b may include transistors TU2 and TL2, an inductor L2, and a PWM circuit 210.

The PWM circuit 210 may generate a PWM signal PWM having a period corresponding to the frequency of the first clock signal CLK0. The PWM signal PWM may have an on/off duty ratio, and alternately turn on/off the transistors TL2 and TU2 (e.g., may turn each transistor on and off alternatingly, and/or may turn transistor TL2 on and transistor TU2 off, then turn transistor TL2 off and transistor TU2 on, alternatingly). The duty ratio of the PWM signal PWM may be determined independently from the frequency of the first clock signal CLK0.

First, when the transistor TU2 is turned on and the transistor TL2 is turned off, energy is stored in the inductor L2 while the current of the inductor L2 is increasing. Next, when the transistor TU2 is turned off and the transistor TL2 is turned on, the energy of the inductor L2 is discharged while the current of the inductor L2 is decreasing. Since an input voltage Vin is separated from an output terminal, a decreased driving voltage AVDD is output (e.g., at the output terminal) based on a current flowing from the inductor L2. When the duty ratio of the PWM signal PWM decreases, the driving voltage AVDD can be further decreased (e.g., the transistor TLU2 may have a shorter on-time each period, and less energy can therefore be stored in inductor L2 to be discharged and generate voltage AVDD).

In some embodiments, such as those described in FIGS. 5 and 6, a single boost converter or a single buck converter may be used. However, in other embodiments, various suitable converters known in the art (such as a buck-boost converter in which a boost converter and a buck converter are integrated, a Cuk converter, and a flyback converter) may be employed as the DC-DC converter 200.

Figure 7:
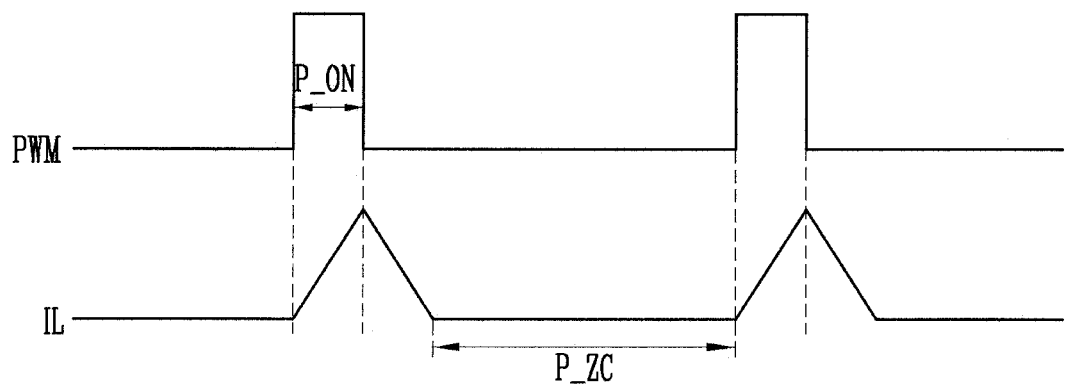
FIG. 7 is a diagram illustrating a relationship between a PWM signal and an inductor current.

FIG. 7 is a diagram illustrating a relationship between a PWM signal and an inductor current.

As described with reference to FIGS. 5 and 6, when the duty ratio of the PWM signal PWM increases, an inductor current IL flowing in the inductors L1 and L2 may increase. That is, the inductor current IL may increase during an on-time P_ON of the PWM signal PWM, and may decrease in the other period of the PWM signal PWM.

The driving voltage provider 15 may provide a small driving voltage AVDD (e.g., may reduce the driving voltage provided) by decreasing the on-time P_ON when a load decreases.

In particular, when the DC-DC converter 200 is driven such that a section P_ZC in which the inductor current IL is 0 occurs, the DC-DC converter 200 is in a Discontinuous Conduction Mode (DCM).

However, when the frequency of the first clock signal CLK0 provided to the PWM circuit 210 is equally maintained even in this case (e.g., remains at a constant value, even when the DC-DC converter 200 is in DCM), equal or similar control power is consumed even when the load decreases.

Figure 8:
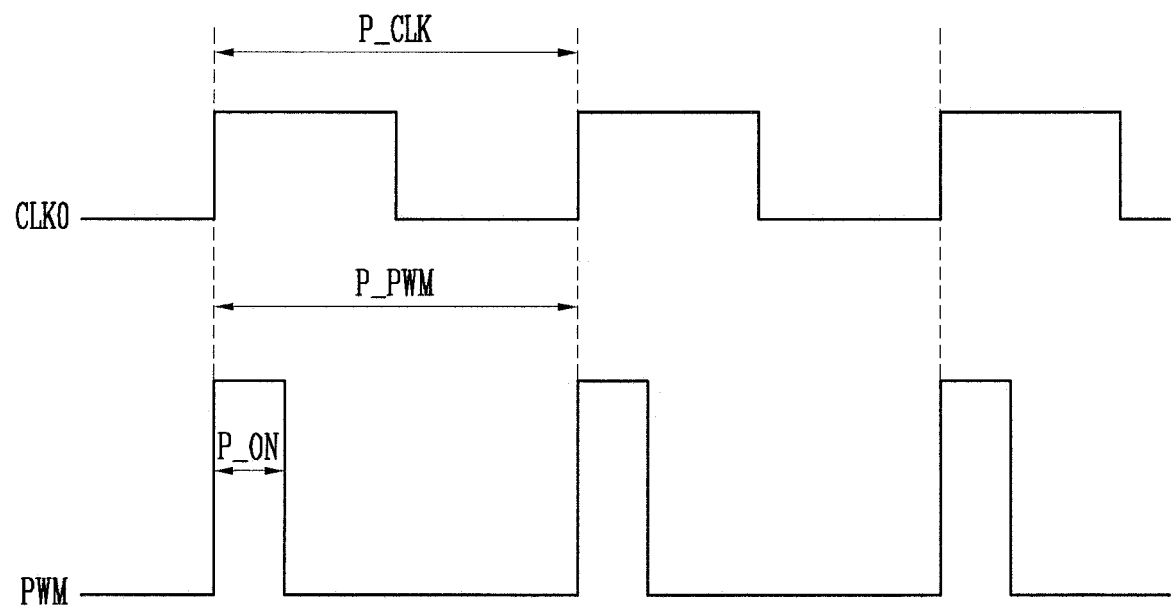
FIG. 8 is a diagram illustrating a relationship between the PWM signal and a first clock signal.

FIG. 8 is a diagram illustrating a relationship between the PWM signal and the first clock signal.

The frequency of the first clock signal CLK0 may be determined to have a period P_CLK.

The PWM signal PWM may have a period P_PWM corresponding to the frequency of the first clock signal CLK0. In an example, the PWM circuit 210 may be configured such that the period P_PWM of the PWM signal PWM is equal to that P_CLK of the first clock signal CLK0. In another example, the PWM circuit 210 may be configured such that the period P_PWM of the PWM signal PWM becomes integer times or fractional times of the period P_CLK of the first clock signal CLK0 (e.g., the period P_PWM may be directly proportional to the period P_CLK of the first clock signal CLK0).

The PWM signal PWM may have a duty ratio. The duty ratio may refer to a ratio of on-time P_ON to one period P_PWM. That is, the duty ratio may increase when the on-time P_ON is lengthened.

The magnitude of the driving voltage AVDD output from the DC-DC converter 200 depends on the duty ratio of the PWM signal PWM, and may not depend on the period P_PWM of the PWM signal PWM (e.g., where the duty ratio remains the same).

When the period P_PWM of the PWM signal PWM is shortened, a ripple of the driving voltage AVDD may decrease, but the control power and thermal stress of the driving voltage provider 15 may be increased. On the contrary, when the period P_PWM of the PWM signal PWM is lengthened, the ripple of the driving voltage AVDD may increase, but the control power and thermal stress of the driving voltage provider 15 may be decreased.

The driving voltage provider 15 of this embodiment detects an on-time P_ON of the PWM signal PWM, and increases the period P_PWM of the PWM signal PWM when the on-time P_ON decreases, so that the control power and thermal stress of the driving voltage provider 15 can be decreased. When the on-time P_ON is short, it may be determined that the load of the display device 10 is small. The case where the load of the display device 10 is small may correspond to a blank period in which data voltages and scan signals are not supplied. Therefore, although the ripple of the driving voltage AVDD increase since the period P_PWM of the PWM signal PWM is lengthened, this may have little or no influence on an image displayed by the pixel unit 14 (e.g., a display unit). Thus, according to this embodiment, display deterioration of the display device 10 can be reduced or minimized, and the control power and thermal stress of the driving voltage provider 15 can be decreased.

Figure 9:
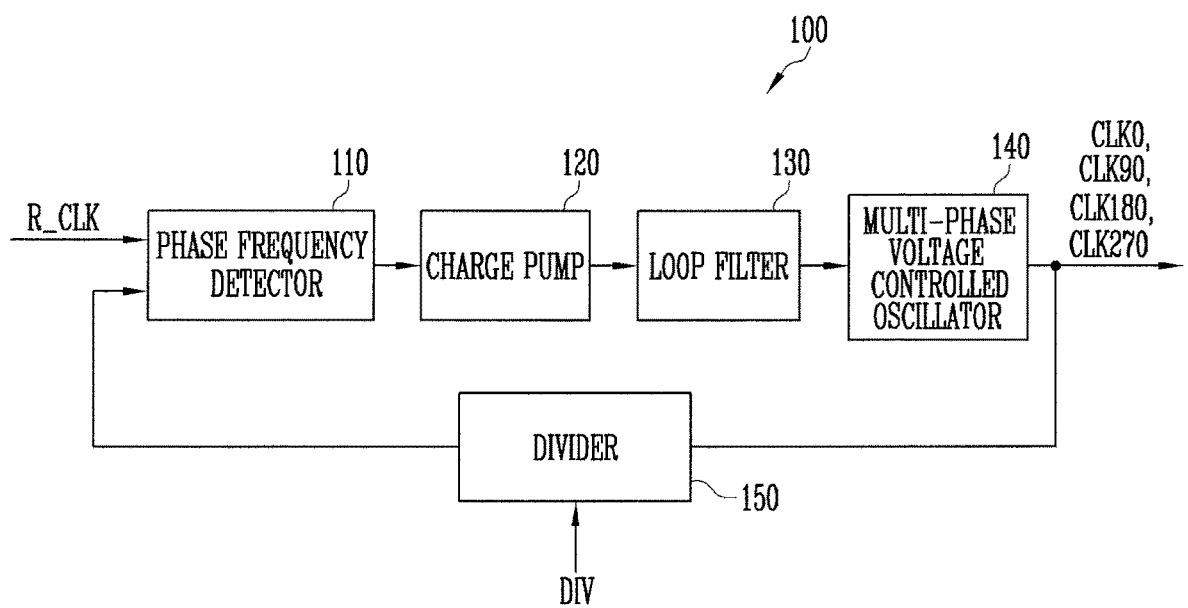
FIG. 9 is a diagram illustrating a PLL circuit according to an embodiment of the present disclosure.

FIG. 9 is a diagram illustrating a PLL circuit according to an embodiment of the present disclosure.

The PLL circuit 100 may include a phase frequency detector 110, a charge pump 120, a loop filter 130, a multi-phase voltage controlled oscillator 140, and a divider 150.

The phase frequency detector 110 may compare a reference clock signal R_CLK and an output signal of the divider 150, and generate an up signal or a down signal such that the phase and frequency of the output signal of the divider 150 are equal to those of the reference clock signal R_CLK.

The charge pump 120 may increase the supply of charge in response to the up signal output from the phase frequency detector 110, and decrease the supply of charge in response to the down signal.

The loop filter 130 may include, for example, a capacitor, and generate a control voltage with respect to ground at one terminal of the capacitor, corresponding to an amount of charge supplied by the charge pump 120.

The control voltage may be applied to the multi-phase voltage controlled oscillator 140, and the multi-phase voltage controlled oscillator 140 may generate first to fourth clock signals CLK0, CLK90, CLK180, and CLK270 of which frequencies or phases are controlled according to the control voltage.

The first to fourth clock signals CLK0, CLK90, CLK180, and CLK270 may be clock signals that have the same frequency but have different phases. For example, the second clock signal CLK90 may be a signal of which the phase is delayed by 90 degrees with respect to that of the first clock signal CLK0, the third clock signal CLK180 may be a signal of which the phase is delayed by 90 degrees with respect to that of the second clock signal CLK90, and the fourth clock signal CLK270 may be a signal of which the phase is delayed by 90 degrees with respect to that of the third clock signal CLK180. Note, although embodiments described herein include first through fourth clock signals, in some alternative embodiments, the multi-phase voltage controlled oscillator may generate other numbers of clock signals with different degrees of phase shift, which may be appropriately determined. For example, in some embodiments the multi-phase voltage controlled oscillator may generate five clock signals with different phases offset by 72 degrees from each other.

Referring to the embodiment of FIG. 9, the divider 150 may divide and output at least one of the first to fourth clock signals CLK0, CLK90, CLK180, and CLK270 according to a divider value DIV (e.g., may output a signal having a frequency equal to the frequency of the at least one of the first to fourth clock signals divided by the divider value DIV. For example, the divider 150 may divide and output a clock signal of which the phase is equal to that of the reference clock signal R_CLK among the first to fourth clock signals CLK0, CLK90, CLK180, and CLK270 according to the divider value DIV.

For example, when the frequency of the reference clock signal R_CLK is 100 KHz, and the divider value DIV is 1, the frequency of the clock signals CLK0, CLK90, CLK180, and CLK270 output from the PLL circuit 100 may be 100 KHz. In order to increase the frequency of the clock signals CLK0, CLK90, CLK180, and CLK270, the divider value DIV may be increased. For example, when the divider value DIV is increased to 2, the output signal of the divider 150 may be a similar clock signal having a frequency of 50 KHz. The phase frequency detector 110 may output the up signal and the down signal such that the frequency of the similar clock signal, which is 50 KHz, is tuned to that of the reference clock signal R_CLK, which is 100 KHz. Consequently, the frequency of the clock signals CLK0, CLK90, CLK180, and CLK270 is increased up to 200 KHz such that the frequencies of the output signal of the divider 150 and the reference clock signal R_CLK correspond to each other. When the divider value DIV is decreased, the frequency of the clock signals CLK0, CLK90, CLK180, and CLK270 decreases.

Figure 10:
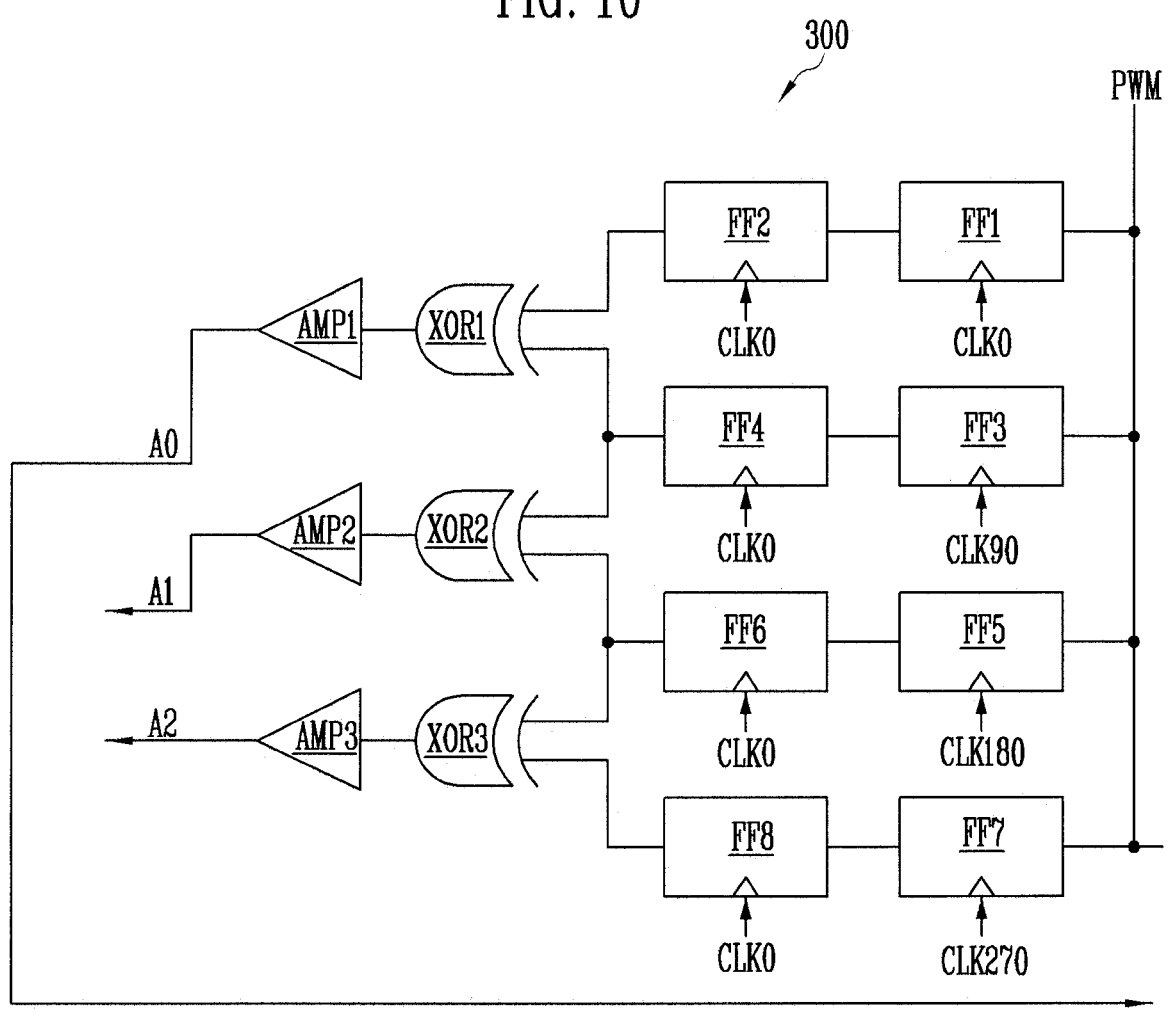
FIG. 10 is a diagram illustrating a first tuning circuit according to an embodiment of the present disclosure.

FIG. 10 is a diagram illustrating a first tuning circuit according to an embodiment of the present disclosure. FIGS.

11 to 14 are diagrams illustrating tuning signals of the first tuning circuit with respect to duty ratios of the PWM signal.

Referring to FIG. 10, the first tuning circuit 300 may include first to eighth flip-flops FF1 to FF8 and first to third XOR gates XOR1, XOR2, and XOR3. In some embodiments, the first tuning circuit 300 may further include amplifiers AMP1, AMP2, and AMP3 to amplify the output signals of the XOR gates XOR1, XOR2, and XOR3. The first to eighth flip-flops FF1 to FF8 may be D flip-flops. In another embodiment, the first to eighth flip-flops FF1 to FF8 may be configured with various suitable types of flip-flops such as a JK flip-flop, a T flip-flop, and/or an RS flip-flop.

The first tuning circuit 300 may be a coarse tuning circuit for approximately detecting a duty ratio of the PWM signal PWM.

A first flip-flop FF1 may sample the PWM signal PWM according to the first clock signal CLK0. A second flip-flop FF2 may sample an output signal of the first flip-flop FF1 according to the first clock signal CLK0.

A third flip-flop FF3 may sample the PWM signal PWM according to the second clock signal CLK90. A fourth flip-flop FF4 may sample an output signal of the third flip-flop FF3 according to the first clock signal CLK0.

A fifth flip-flop FF5 may sample the PWM signal PWM according to the third clock signal CLK180. A sixth flip-flop FF6 may sample an output signal of the fifth flip-flop FF5 according to the first clock signal CLK0.

A seventh flip-flop FF7 may sample the PWM signal PWM according to the fourth clock signal CLK270. An eighth flip-flop FF8 may sample an output signal of the seventh flip-flop FF7 according to the first clock signal CLK0.

A first XOR gate XOR1 may receive output signals of the second and fourth flip-flops FF2 and FF4.

A second XOR gate XOR2 may receive output signals of the fourth and sixth flip-flops FF4 and FF6.

A third XOR gate XOR3 may receive output signals of the sixth and eighth flip-flops FF6 and FF8.

The first tuning signal A0 may correspond to an output signal of the first XOR gate XOR1. In some embodiments, the first tuning signal A0 may be amplified by a first amplifier AMP1.

The third tuning signal A1 may correspond to an output signal of the second XOR gate XOR2. In some embodiments, the third tuning signal A1 may be amplified by a second amplifier AMP2.

The fourth tuning signal A2 may correspond to an output signal of the third XOR gate XOR3. In some embodiments, the fourth tuning signal A2 may be amplified by a third amplifier AMP3.

Figure 11:
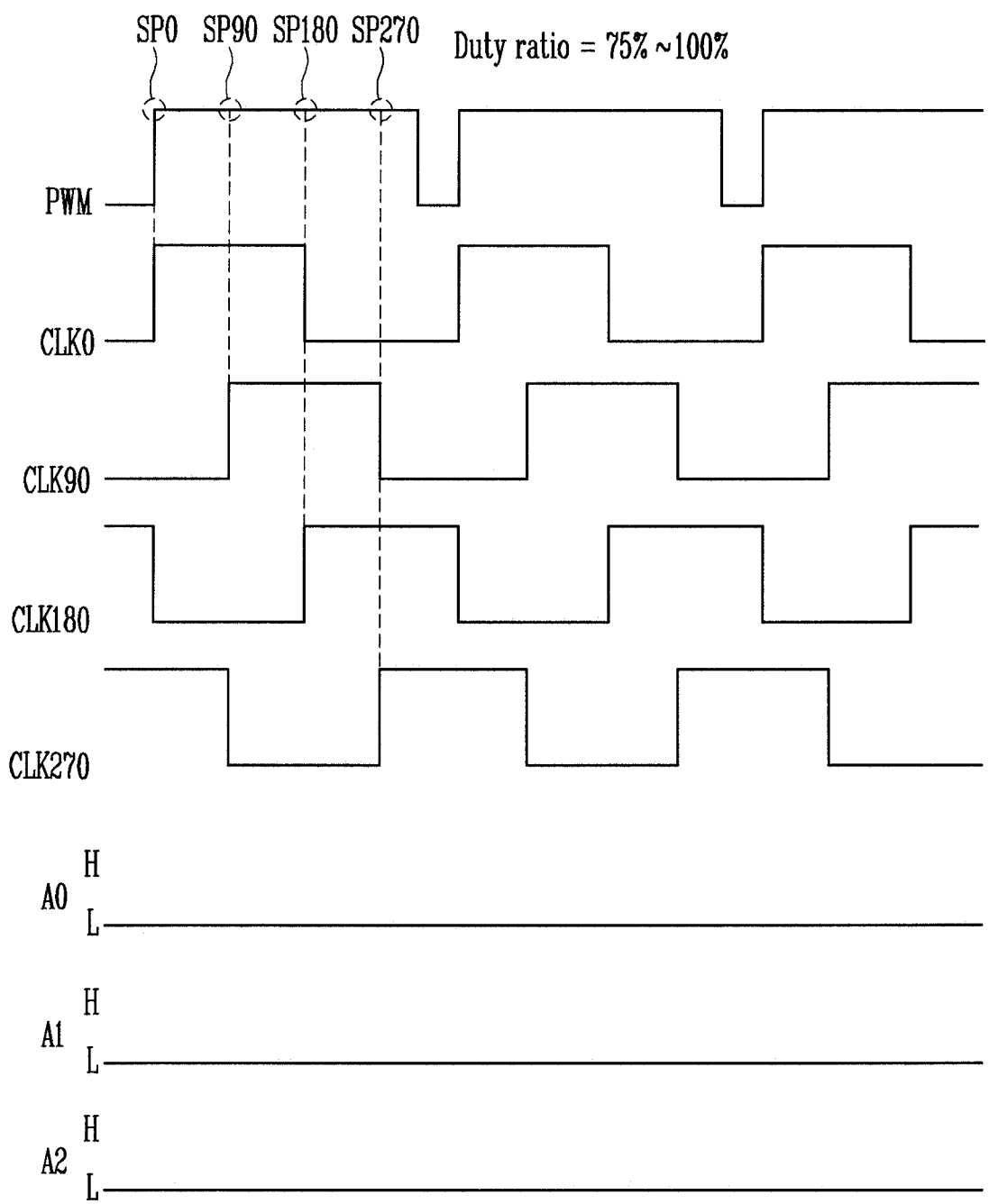
FIGS. 11 to 14 are diagrams illustrating tuning signals of the first tuning circuit with respect to duty ratios of the PWM signal.
Figure 12:
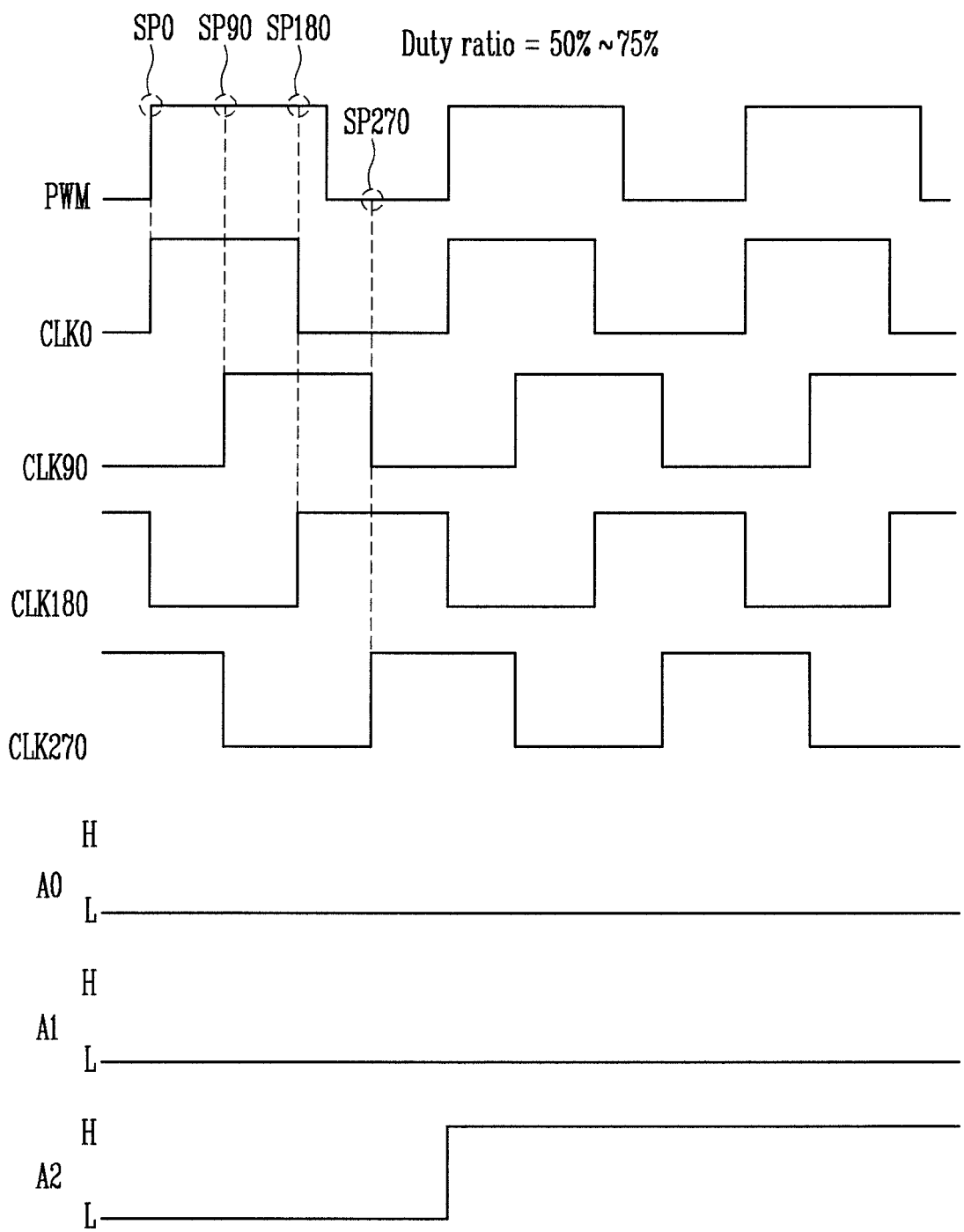
Figure 13:
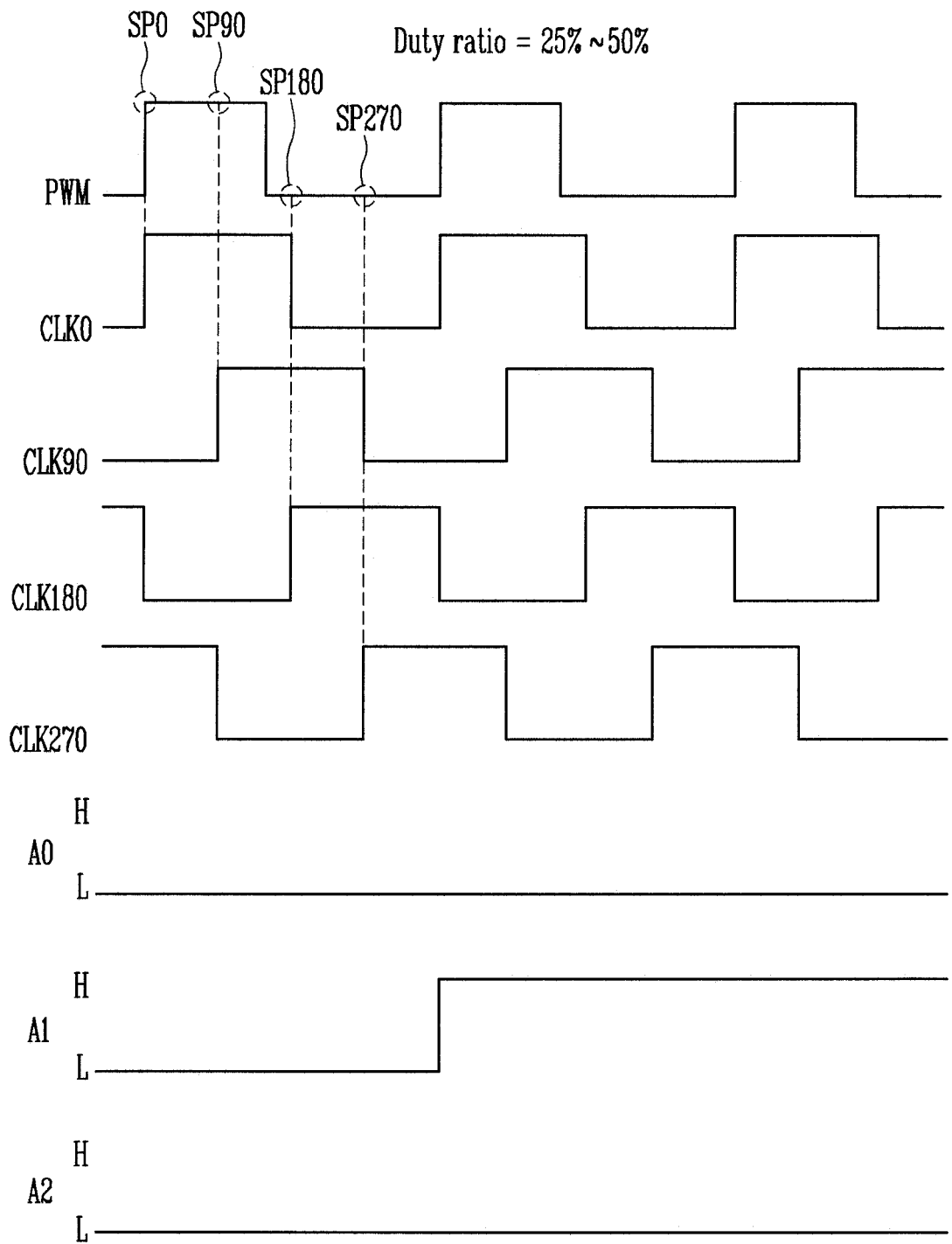
Figure 14:
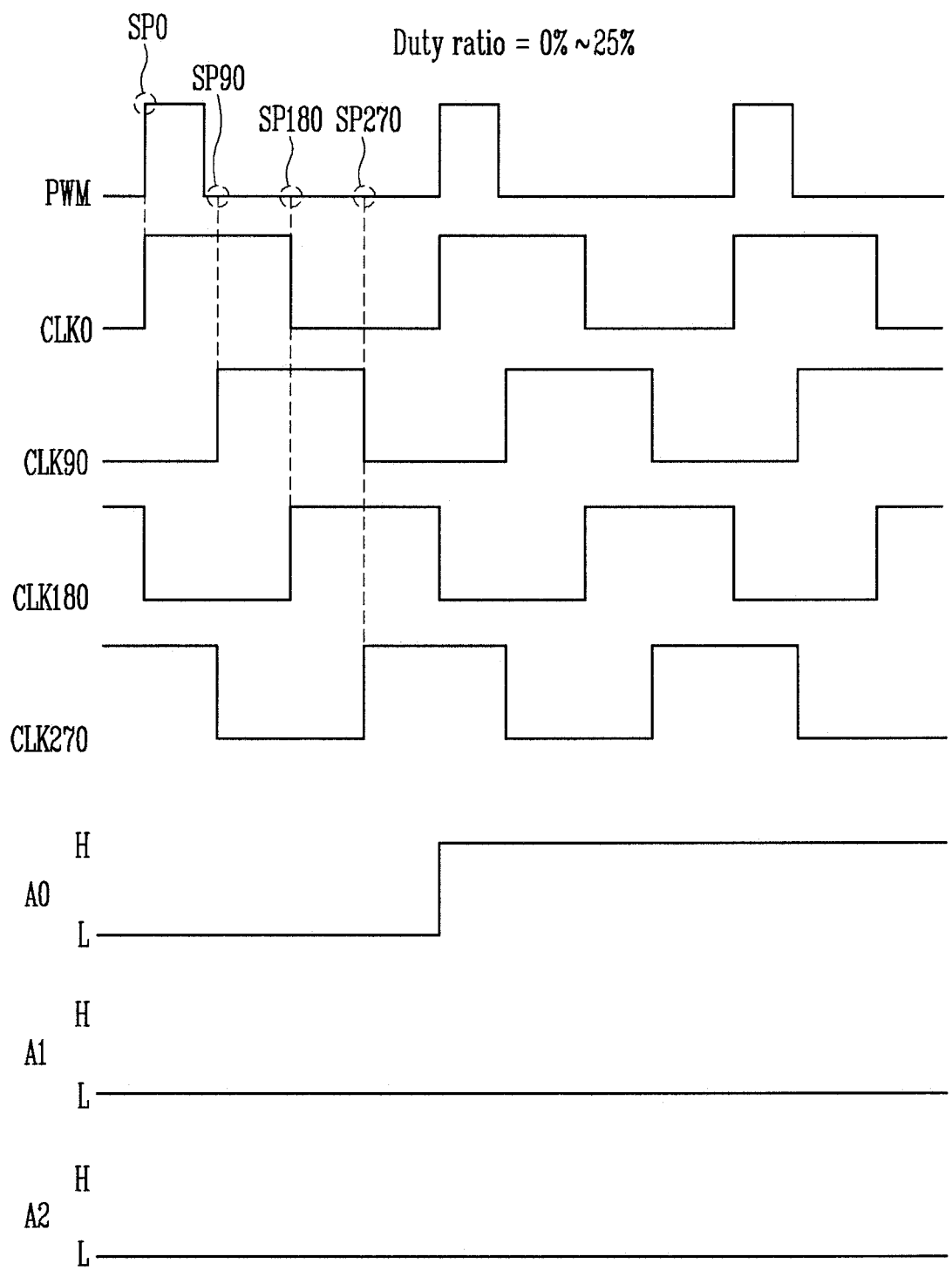

Hereinafter, an operation of components of FIG. 10 will be described with reference to FIGS. 11 to 14. FIG. 11 illustrates a case where the duty ratio of the PWM signal PWM is 75% to 100%, FIG. 12 illustrates a case where the duty ratio of the PWM signal PWM is 50% to 75%, FIG. 13 illustrates a case where the duty ratio of the PWM signal PWM is 25% to 50%, and FIG. 14 illustrates a case where the duty ratio of the PWM signal PWM is 0% to 25%.

First, the first flip-flop FF1 may generate a first sampling signal SP0 by sampling the PWM signal PWM at a transition time of the first clock signal CLK0. The transition time of a clock signal may include a rising transition time and a falling transition time. Hereinafter, for convenience of description, it is assumed that sampling is performed at the rising transition time.

In addition, the third flip-flop FF3 may generate a second sampling signal SP90 by sampling the PWM signal PWM at a transition time of the second clock signal CLK90.

Next, the first tuning signal A0 may be generated when the second flip-flop FF2 and the fourth flip-flop FF4 simultaneously or concurrently operate according to the transition time of the first clock signal CLK0. For example, in FIGS. 11, 12, and 13, the logic level of the first sampling signal SP0 is a high level, and the logic level of the second sampling signal SP90 is the high level. Therefore, the logic level of the first tuning signal A0 is a low level. In FIG. 14, the logic level of the first sampling signal SP0 is the high level, and the logic level of the second sampling signal SP90 is the low level. Therefore, the logic level of the first tuning signal A0 is the high level (or becomes the high level when the second flip-flop FF2 and the fourth flip-flop FF4 simultaneously or concurrently operate according to the transition time of the first clock signal CLK0).

In a similar manner, the third tuning signal A1 may be generated by operations of the flip-flops FF3, FF4, FF5, and FF6, and the second XOR gate XOR2. For example, in FIGS. 11, and 12, the logic level of the second sampling signal SP90 is the high level, and the logic level of a third sampling signal SP180 generated by the fifth flip-flop FF5 is the high level. Therefore, the logic level of the third tuning signal A1 is the low level. In FIG. 13, the logic level of the second sampling signal SP90 is the high level, and the logic level of the third sampling signal SP180 is the low level. Therefore, the logic level of the third tuning signal A1 is the high level (or becomes the high level when the fourth flip-flop FF4 and the sixth flip-flop FF6 simultaneously or concurrently operate according to the transition time of the first clock signal CLK0). In FIG. 14, the logic level of the second sampling signal SP90 is the low level, and the logic level of the third sampling signal SP180 is the low level. Therefore, the logic level of the third tuning signal A1 is the low level.

In similar manner, the fourth tuning signal A2 may be generated by operations of the flip-flops FF5, FF6, FF7, and FF8, and the third XOR gate XOR3. For example, in FIG. 11, the logic level of the third sampling signal SP180 is the high level, and the logic level of a fourth sampling signal SP270 generated by the seventh flip-flop FF7 is the high level. Therefore, the logic level of the fourth tuning signal A2 is the low level. In FIG. 12, the logic level of the third sampling signal SP180 is the high level, and the logic level of the fourth sampling signal SP270 is the low level. Therefore, the logic level of the fourth tuning signal A2 is the high level (or becomes the high level when the sixth flip-flop FF6 and the eighth flip-flop FF8 simultaneously or concurrently operate according to the transition time of the first clock signal CLK0). In FIGS. 13 and 14, the logic level of the third sampling signal SP180 is the low level, and the logic level of the fourth sampling signal SP270 is the low level. Therefore, the logic level of the fourth tuning signal A2 is the low level.

Figure 15:
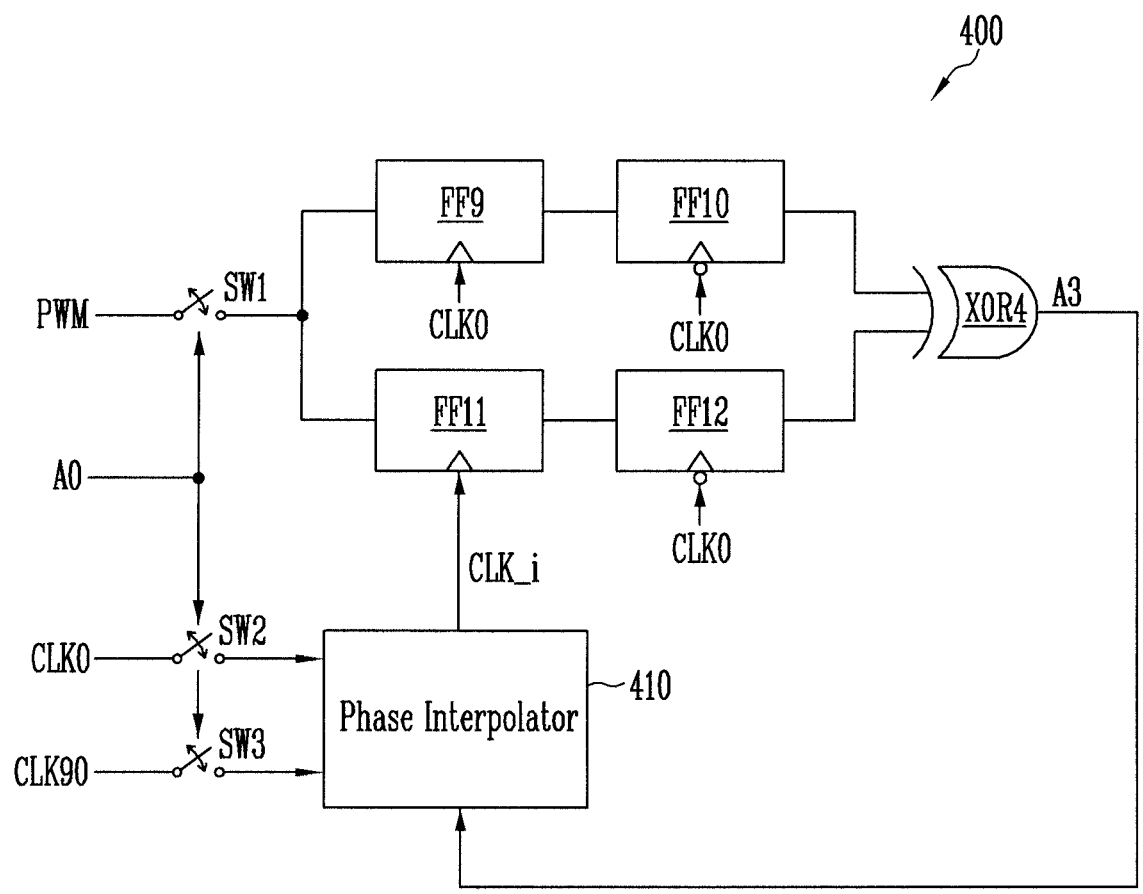
FIG. 15 is a diagram illustrating a second tuning circuit according to an embodiment of the present disclosure.
Figure 16:
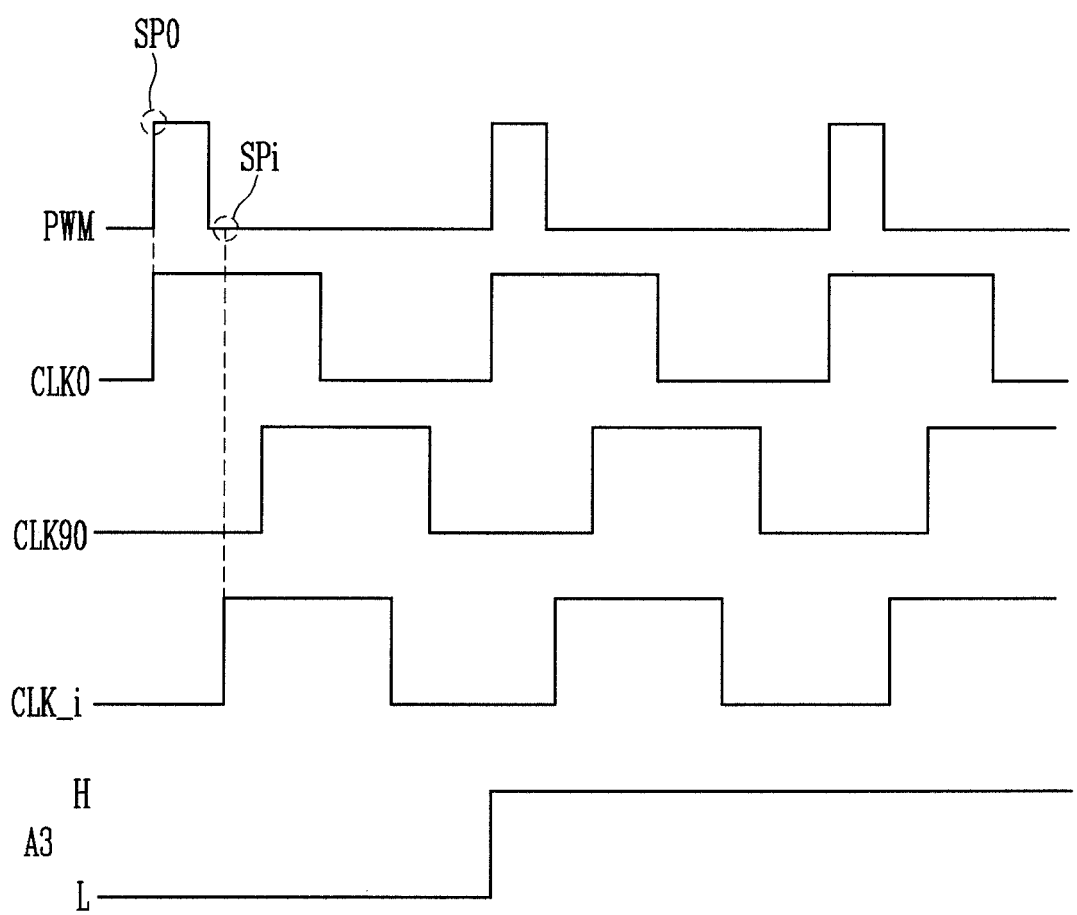
FIGS. 16 and 17 are diagrams illustrating tuning signals of the second tuning circuit with respect to duty ratios of the PWM signal.
Figure 17:
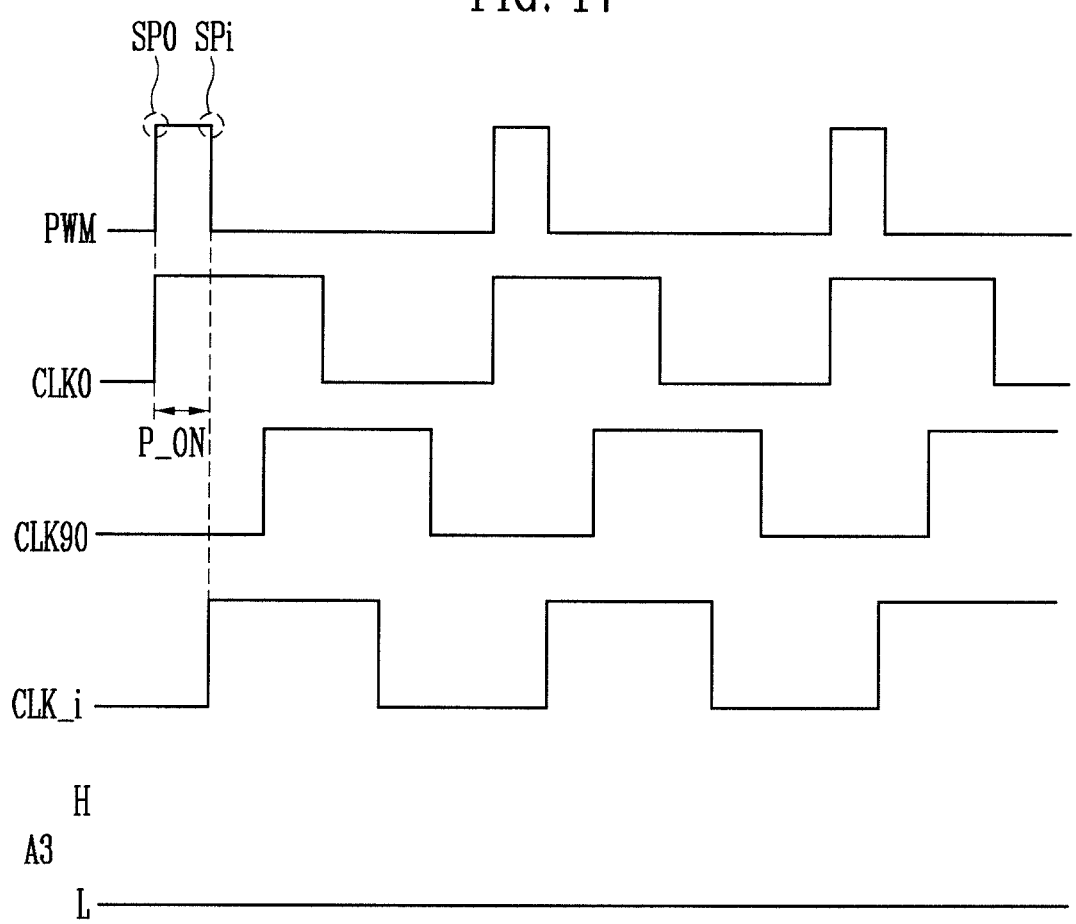

FIG. 15 is a diagram illustrating a second tuning circuit according to an embodiment of the present disclosure. FIGS. 16 and 17 are diagrams illustrating tuning signals of the second tuning circuit with respect to duty ratios of the PWM signal.

Referring to FIG. 15, the second tuning circuit 400 may include switches SW1, SW2, and SW3, ninth to twelfth flip-flops FF9, FF10, FF11, and FF12, a fourth XOR gate XOR4, and a phase interpolator 410.

The second tuning circuit 400 may be a fine tuning circuit for finely detecting a duty ratio of the PWM signal.

The turn-on/turn-off of a first switch SW1 may be controlled according to the first tuning signal A0 to provide the PWM signal PWM. The turn-on/turn-off of a second switch SW2 may be controlled according to the first tuning signal A0 to provide the first clock signal CLK0. The turn-on/turn-off of a third switch SW3 may be controlled according to the first tuning signal A0 to provide the second clock signal CLK90.

A ninth flip-flop FF9 may sample an output signal of the first switch SW1 according to the first clock signal CLK0. A tenth flip-flop FF10 may sample an output signal of the ninth flip-flop FF9 according to the first clock signal CLK0.

An eleventh flip-flop FF11 may sample the output signal of the first switch SW1 according to an interpolation clock signal CLK_i. A twelfth flip-flop FF12 may sample an output signal of the eleventh flip-flop FF11 according to the first clock signal CLK0.

The phase interpolator 410 may be enabled or disabled by the second tuning signal A3. When the phase interpolator 410 is enabled, the phase interpolator 410 may receive output signals of the second and third switches SW2 and SW3, to generate the interpolation clock signal CLK_i. For example, the phase interpolator 410 may be enabled when the logic level of the second tuning signal A3 is the high level, and be disabled when the logic level of the second tuning signal A3 is the low level.

The fourth XOR gate XOR4 may receive output signals of the tenth and twelfth flip-flops FF10 and FF12, to generate the second tuning signal A3.

Hereinafter, an operation of each component of FIG. 15 will be described with reference to FIGS. 16 and 17.

In FIG. 14, the logic level of the first tuning signal A0 may be the high level. When the logic level of the first tuning signal A0 is the high level, it can be seen that the duty ratio of the PWM signal PWM falls in the range of 0% to 25%, but the first tuning circuit 300 may not detect where within that range the duty cycle falls. According to the following driving method, the second tuning circuit 400 can more accurately detect the duty ratio of the PWM signal PWM.

First, when the logic level of the first tuning signal A0 is the high level, the second and third switches SW2 and SW3 are turned on, and therefore, the phase interpolator 410 may receive the first clock signal CLK0 and the second clock signal CLK90. The phase interpolator 410 may generate an interpolation clock signal CLK_i by interpolating the first clock signal CLK0 and the second clock signal CLK90 (e.g., may generate the interpolation clock signal CLK_i to have the same period as the first and second clock signals CLK0 and CLK90 with phase offset between that of the first and second clock signals CLK0 and CLK90). The phase of the interpolation clock signal CLK_i may correspond to a value between the phase of the first clock signal CLK0 and the phase of the second clock signal CLK90. For example, the phase of an initial interpolation clock signal CLK_i may be closer to the phase of the second clock signal CLK90 than the phase of the first clock signal CLK0. That is, the amount of the phase delay of the interpolation clock signal CLK_i may equal or similar to that of the second clock signal CLK90.

Also, when the first tuning signal A0 is the high level, the first switch SW1 is turned on. Therefore, the ninth flip-flop FF9 generates a first sampling signal SP0 by sampling the PWM signal PWM at the transition time of the first clock signal CLK0. In addition, the eleventh flip-flop FF11 generates an interpolation sampling signal SPi by sampling the PWM signal PWM at a transition time of the interpolation clock signal CLK_i.

Next, the fourth XOR gate XOR4 may generate the second tuning signal A3 when the tenth flip-flop FF10 and the twelfth flip-flop FF12 simultaneously or concurrently operate at the transition time of the first clock signal CLK0. Referring to FIG. 16, the logic level of the first sampling signal SP0 is the high level, and the logic level of the interpolation sampling signal SPi is the low level. Therefore, the logic level of the second tuning signal A3 is the high level (or becomes the high level when the tenth flip-flop FF10 and the twelfth flip-flop FF12 simultaneously or concurrently operate at the transition time of the first clock signal CLK0).

Since the logic level of the second tuning signal A3 is the high level, the phase interpolator 410 may be enabled to change the phase of the interpolation clock signal CLK_i. For example, the phase interpolator 410 may move the phase of the interpolation clock signal CLK_i closer to that of the first clock signal CLK0. That is, the phase delay amount of the interpolation clock signal CLK_i can be decreased. This procedure may be repeated until the logic level of the second tuning signal A3 is the low level.

When the logic level of the second tuning signal A3 is the low level, the phase interpolator 410 may be disabled. Referring to FIG. 17, the logic level of the first sampling signal SP0 is the high level, and the logic level of the interpolation sampling signal SPi is the high level. Therefore, the logic level of the second tuning signal A3 is the low level. The period of time corresponding to the phase difference between the first clock signal CLK0 and the interpolation clock signal CLK_i is equal to or smaller than the on-time P_ON of the PWM signal PWM.

Hereinafter, a method of determining, by the divider value determiner 500 of FIG. 4, a divider value DIV, using the generated first to fourth tuning signals A0, A3, A1, and A2.

According to an embodiment, the divider value determiner 500 may determine a divider value DIV, based on output values of the first tuning circuit 300.

When all the first, third, and fourth tuning signals A0, A1, and A2 have the low level, the divider value determiner 500 may maintain the divider value DIV. When the first tuning signal A0 has the high level, the divider value determiner 500 may decrease the divider value DIV by a first decrement amount. When the third tuning signal A1 has the high level, the divider value determiner 500 may decrease the divider value DIV by a second decrement amount. When the fourth tuning signal A2 has the high level, the divider value determiner 500 may decrease the divider value DIV by a third decrement amount. The second decrement amount may be less than the first decrement amount, and the third decrement amount may be less than the second decrement amount.

That is, when the duty ratio of the PWM signal PWM decreases, the divider value determiner 500 may further decrease the divider value DIV. Referring back to FIG. 10, when the divider value DIV decreases, the frequency of the clock signals CLK0, CLK90, CLK180, and CLK270 is decreased. Thus, when a load decreases (e.g., the load presented to the DC-DC converter 200 decreases), the driving voltage provider 15 of this embodiment decreases the frequency of the clock signals CLK0, CLK90, CLK180, and CLK270. Accordingly, the consumption of control power can be reduced, and thermal stress can be decreased.

According to an additional embodiment, the divider value determiner 500 may determine a divider value DIV, based on output values of the first tuning circuit 300 and the second tuning circuit 400.

When the logic level of the first tuning signal A0 is the high level, the divider value determiner 500 may determine a first decrement amount, based on the logic level of the second tuning signal A3. For example, when the logic level of the first tuning signal A0 is the high level, the divider value determiner 500 may determine the first decrement amount, based on a count number. In each count time point, the count number may be increased when the logic level of the second tuning signal A3 is the high level. In each count time point, the count number may be maintained when the logic level of the second tuning signal A3 is the low level. The count time point may be synchronized with the transition time of the first clock signal CLK0, which is a reference of sampling time.

The divider value determiner 500 may increase the first decrement amount when the count number increases. That is, that the count number increases means that the duty ratio of the PWM signal PWM decreases. Thus, the divider value determiner 500 further increases the first decrement amount, so that the frequency of the clock signals CLK0, CLK90, CLK180, and CLK270 can be further decreased. Accordingly, the driving voltage provider 15 of this embodiment can reduce the consumption of control power and decrease thermal stress.

Figure 18:
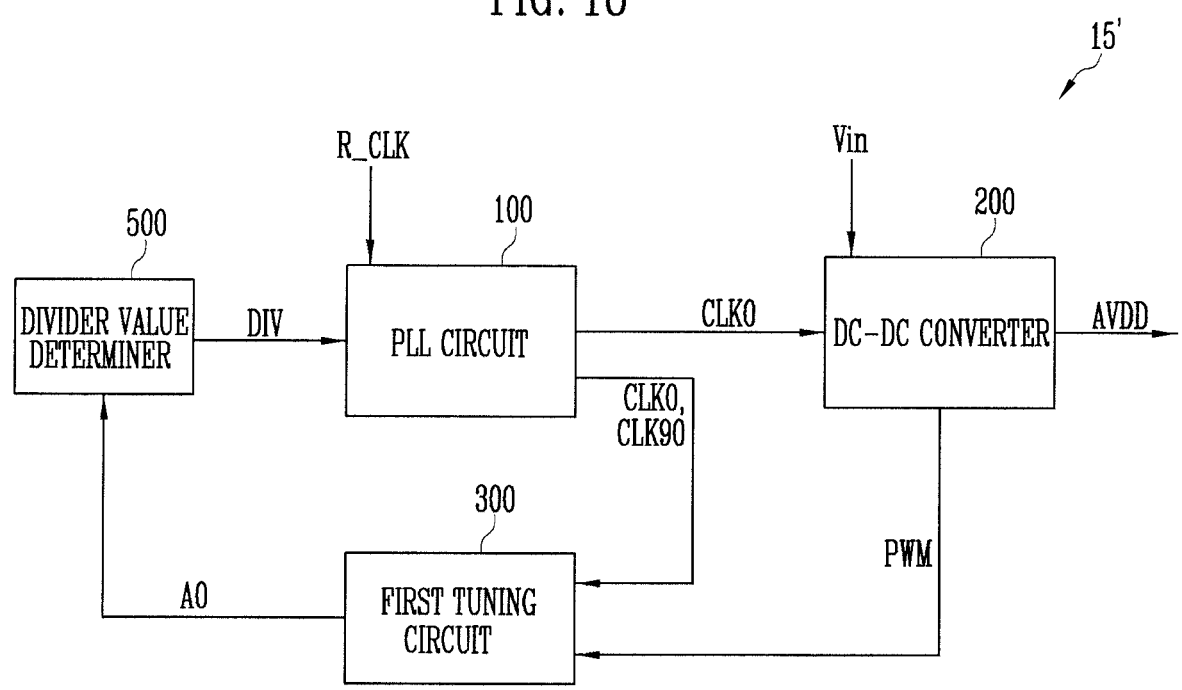
FIG. 18 is a diagram illustrating a driving voltage provider according to another embodiment of the present disclosure.

FIG. 18 is a diagram illustrating a driving voltage provider according to another embodiment of the present disclosure.

As compared with the driving voltage provider 15 of FIG. 4, the driving voltage provider 15' of FIG. 18 does not include the second tuning circuit 400.

In addition, a PLL circuit 100 of the driving voltage provider 15' generates only the first clock signal CLK0 and the second clock signal CLK90.

A first tuning circuit 300 may minimally include flip-flops FF1, FF2, FF3, and FF4, and a first XOR gate XOR1, which generate the first tuning signal A0. In some embodiments, the first tuning circuit 300 may further include a first amplifier AMP1.

Since a divider value determiner 500 of the driving voltage provider 15' does not count the logic level of the second tuning signal A3, the divider value determiner 500 may not receive the first clock signal CLK0.

According to the embodiment of FIG. 18, like the case of FIG. 14, it can be seen that the duty ratio of the PWM signal PWM belongs to the range of 0% to 25% (e.g., the divider value determiner 500 can detect when the duty ration of the PWM signal PWM is between 0% and 25% based on the first tuning signal A0 from the first tuning circuit 300). When the logic level of the first tuning signal A0 is the high level, the divider value determiner 500 may decrease the divider value DIV by the first decrement amount. Also, when the logic level of the first tuning signal A0 is the low level, the divider value determiner 500 may maintain the divider value DIV at its current value.

According to this embodiment, with respect to a specific duty ratio range, the driving voltage provider 15' can reduce the consumption of control power and decrease thermal stress.

Figure 19:
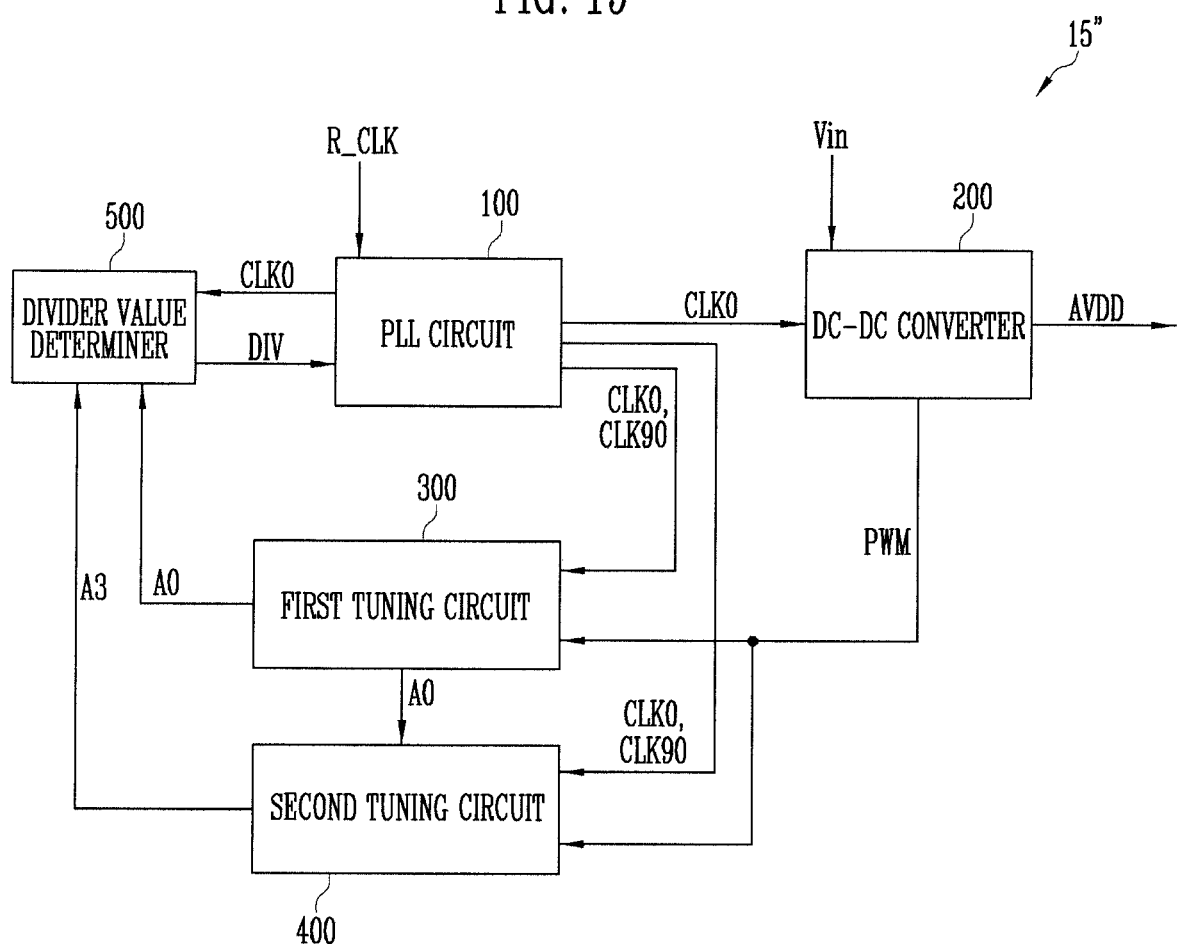
FIG. 19 is a diagram illustrating a driving voltage provider according to still another embodiment of the present disclosure.

FIG. 19 is a diagram illustrating a driving voltage provider according to still another embodiment of the present disclosure.

As compared with the driving voltage provider 15' of FIG. 18, the driving voltage provider 15" of FIG. 19 further includes a second tuning circuit 400.

The configuration of a first tuning circuit 300 may be similar or identical to that of the first tuning circuit 300 in the driving voltage provider 15' of FIG. 18.

The configuration of the second tuning circuit 400 may be similar or identical to that of the second tuning circuit 400 of FIG. 15.

A divider value determiner 500 of the driving voltage provider 15" may receive the first clock signal CLK0.

According to the embodiment of the FIG. 19, like the case of FIG. 14, it can be seen that the duty ratio of the PWM signal PWM belongs to the range of 0% to 25%. Like the cases of FIGS. 16 and 17, it can be seen in more detail that the duty ratio of the PWM signal PWM belongs to the range of 0% to 25%. When the logic level of the first tuning signal A0 is the high level, the divider value determiner 500 may decrease the divider value DIV by the first decrement amount. Also, when the logic level of the first tuning signal A0 is the low level, the divider value determiner 500 may maintain the divider value DIV at its current value. Also, when the logic level of the first tuning signal A0 is the high level, the divider value determiner 500 may determine the first decrement amount, based on the logic level of the second tuning signal A3. A method of determining the first decrement amount is described above with respect to the embodiment depicted in FIG. 17.

According to this embodiment, with respect to a specific duty ratio range, the driving voltage provider 15" can reduce the consumption of control power and decrease thermal stress.

According to the present disclosure, the driving voltage provider can reduce the consumption of control power and decrease thermal stress when a load decreases.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Example embodiments have been disclosed herein, and although specific terms are employed, they are used and are to be interpreted in descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, and equivalents thereof.

What is claimed is:

1. A driving voltage provider comprising:
   a phase locked loop (PLL) circuit configured to generate a first clock signal and a second clock signal having different phases, according to a divider value and a reference clock signal;
   a DC-DC converter configured to generate a pulse width modulation (PWM) signal according to the frequency of the first clock signal, and generate a driving voltage according to a duty ratio of the PWM signal;
   a first tuning circuit configured to output a first tuning signal having a first logic level when a logic level of a first sampling signal obtained by sampling the PWM signal at a transition time of the first clock signal is different from a logic level of a second sampling signal obtained by sampling the PWM signal at a transition time of the second clock signal, and output the first tuning signal having a second logic level when the first and second sampling signals have the same logic level; and
   a divider value determiner configured to decrease the divider value by a first decrement amount when the logic level of the first tuning signal is the first logic level.

2. The driving voltage provider of claim 1, further comprising a second tuning circuit configured to:
   generate an interpolation clock signal having a phase between the phase of the first clock signal and the phase of the second clock signal when the logic level of the first tuning signal is the first logic level;
   output a second tuning signal having a third logic level when a logic level of a fifth sampling signal obtained by sampling the PWM signal at the transition time of the first clock signal is different from a logic level of an interpolation sampling signal obtained by sampling the PWM signal at a transition time of the interpolation clock signal; and
   output the second tuning signal having a fourth logic level when the fifth sampling signal and the interpolation sampling signal have the same logic level.

3. The driving voltage provider of claim 2, wherein the second tuning circuit changes the phase of the interpolation clock signal when the second tuning signal having the third logic level is output.

4. The driving voltage provider of claim 3, wherein, when the logic level of the first tuning signal is the first logic level, the divider value determiner determines the first decrement amount based on the logic level of the second tuning signal.

5. The driving voltage provider of claim 4, wherein, when the logic level of the first tuning signal is the first logic level, the divider value determiner determines the first decrement amount based on a count number,
   wherein, in each count time point, the count number is increased when the logic level of the second tuning signal is the third logic level, and
   wherein, in each count time point, the count number is maintained when the logic level of the second tuning signal is the fourth logic level.

6. The driving voltage provider of claim 5, wherein, when the logic level of the first tuning signal is the first logic level, the divider value determiner increases the first decrement amount when the count number increases.

7. The driving voltage provider of claim 5, wherein the count time point is synchronized with the transition time of the first clock signal.

8. The driving voltage provider of claim 3, wherein the PLL circuit is further configured to generate a third clock signal having a phase different from the phase of the first clock signal and the phase of the second clock signal,
   wherein the first tuning circuit outputs a third tuning signal having a fifth logic level when the logic level of the second sampling signal is different from a logic level of a third sampling signal obtained by sampling the PWM signal at a transition time of the third clock signal, and outputs the third tuning signal having a sixth logic level when the second and third sampling signals have the same logic level.

9. The driving voltage provider of claim 8, wherein the divider value determiner decreases the divider value by a second decrement amount when the logic level of the third tuning signal is the fifth logic level,
   wherein the second decrement amount is lower than the first decrement amount.

10. The driving voltage provider of claim 9, wherein the PLL circuit is further configured to generate a fourth clock signal having a phase different from each of the phase of the first clock signal, the phase of the second clock signal, and the phase of the third clock signal,
   wherein the first tuning circuit outputs a fourth tuning signal having a seventh logic level when the logic level of the third sampling signal is different from a logic level of a fourth sampling signal obtained by sampling the PWM signal at a transition time of the fourth clock signal, and outputs the fourth tuning signal having an eighth logic level when the third and fourth sampling signals have the same logic level.

11. The driving voltage provider of claim 10, wherein the divider value determiner decreases the divider value by a third decrement amount when the logic level of the fourth tuning signal is the seventh logic level,
   wherein the third decrement amount is lower than the second decrement amount.

12. The driving voltage provider of claim 11, wherein the first tuning circuit includes:
   a first flip-flop configured to sample the PWM signal according to the first clock signal;
   a second flip-flop configured to sample an output signal of the first flip-flop according to the first clock signal;
   a third flip-flop configured to sample the PWM signal according to the second clock signal;
   a fourth flip-flop configured to sample an output signal of the third flip-flop according to the first clock signal;
   a fifth flip-flop configured to sample the PWM signal according to the third clock signal;
   a sixth flip-flop configured to sample an output signal of the fifth flip-flop according to the first clock signal;
   a seventh flip-flop configured to sample the PWM signal according to the fourth clock signal; and
   an eighth flip-flop configured to sample an output signal of the seventh flip-flop according to the first clock signal.

13. The driving voltage provider of claim 12, wherein the first tuning circuit further includes:
   a first XOR gate configured to receive output signals of the second and fourth flip-flops;
   a second XOR gate configured to receive output signals of the fourth and sixth flip-flops; and
   a third XOR gate configured to receive output signals of the sixth and eighth flip-flops,
   wherein the first tuning signal corresponds to an output signal of the first XOR gate,
   the third tuning signal corresponds to an output signal of the second XOR gate, and
   the fourth tuning signal corresponds to an output signal of the third XOR gate.

14. The driving voltage provider of claim 13, wherein the second tuning circuit includes:
   a first switch configured to turn on or off according to the first tuning signal, the first switch being coupled to the PWM signal;
   a second switch configured to turn on or off according to the first tuning signal, the second switch being coupled to the first clock signal; and
   a third switch configured to turn on or off according to the first tuning signal, the third switch being coupled to the second clock signal.

15. The driving voltage provider of claim 14, wherein the second tuning circuit further includes:
   a ninth flip-flop configured to sample an output signal of the first switch according to the first clock signal;
   a tenth flip-flop configured to sample an output signal of the ninth flip-flop according to the first clock signal;
   an eleventh flip-flop configured to sample the output signal of the first switch according to the interpolation clock signal; and
   a twelfth flip-flop configured to sample an output signal of the eleventh flip-flop according to the first clock signal.

16. The driving voltage provider of claim 15, wherein the second tuning circuit further includes:
   a phase interpolator configured to be enabled or disabled by the second tuning signal, the phase interpolator receiving output signals of the second and third switches to generate the interpolation clock signal when the phase interpolator is enabled; and
   a fourth XOR gate configured to receive output signals of the tenth and twelfth flip-flops to generate the second tuning signal.

* * * * *